United States Patent
Nakamura et al.

(10) Patent No.: US 7,432,574 B2
(45) Date of Patent: Oct. 7, 2008

(54) MAGNETIC RECORDING ELEMENT AND MAGNETIC MEMORY

(75) Inventors: Shiho Nakamura, Fujisawa (JP); Hirofumi Morise, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/725,570

(22) Filed: Mar. 20, 2007

(65) Prior Publication Data

US 2007/0228501 A1    Oct. 4, 2007

(30) Foreign Application Priority Data

Mar. 29, 2006    (JP) .............................. 2006-092230

(51) Int. Cl.
*H01L 29/06* (2006.01)
(52) U.S. Cl. .............................. 257/421; 257/E27.006; 257/295; 257/288; 365/158; 365/171; 365/173
(58) Field of Classification Search ................. 257/421, 257/E27.006
See application file for complete search history.

(56) References Cited

U.S. PATENT DOCUMENTS

| | | | |
|---|---|---|---|
| 6,713,195 B2 * | 3/2004 | Wang et al. ............... | 428/811.2 |
| 6,956,766 B2 | 10/2005 | Nakamura et al. | |
| 7,126,848 B2 | 10/2006 | Nakamura et al. | |
| 7,126,849 B2 | 10/2006 | Nakamura et al. | |
| 7,313,013 B2 * | 12/2007 | Sun et al. | |
| 7,372,116 B2 * | 5/2008 | Fullerton et al. ............ | 257/421 |
| 2005/0104101 A1 | 5/2005 | Sun et al. | |
| 2005/0185455 A1 | 8/2005 | Huai | |
| 2006/0120126 A1 | 6/2006 | Nakamura et al. | |
| 2007/0086121 A1 * | 4/2007 | Nagase et al. | |

FOREIGN PATENT DOCUMENTS

| | | |
|---|---|---|
| JP | 2004-193595 | 7/2004 |
| JP | 2005-093488 | 4/2005 |

OTHER PUBLICATIONS

F.J. Albert et al.: "Spin-polarized current switching of a Co thin film nanomagnet," *American Institute of Physics*, Applied Physics Letters, vol. 77, No. 23, pp. 3809-3811, Dec. 4, 2000.

* cited by examiner

*Primary Examiner*—Tu-Tu V Ho
(74) *Attorney, Agent, or Firm*—Nixon & Vanderhye, PC

(57) ABSTRACT

A magnetic recording element according to an example of the present invention includes a magnetic free layer whose magnetization is variable in accordance with a current direction passing through a film and whose direction of easy axis of magnetization is a direction perpendicular to a film plane, a magnetic pinned layer whose magnetization is fixed to a direction perpendicular to the film plane, and a non-magnetic barrier layer between the magnetic free layer and the magnetic pinned layer. In the magnetic free layer, a relation between a saturated magnetization Ms (emu/cc) and an anisotropy field Han (Oe) satisfies Han>12.57 Ms, and Han<1.2 E7 $Ms^{-1}$+12.57 Ms.

22 Claims, 19 Drawing Sheets

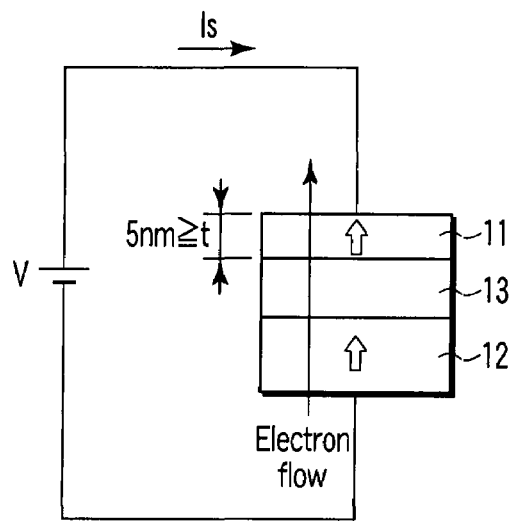
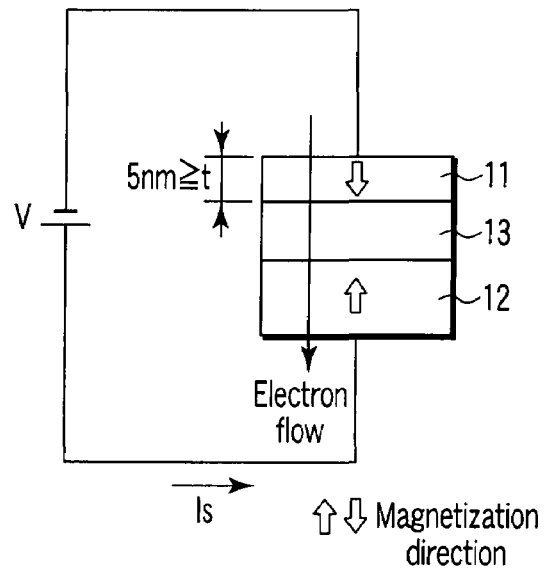
F I G. 1A  F I G. 1B
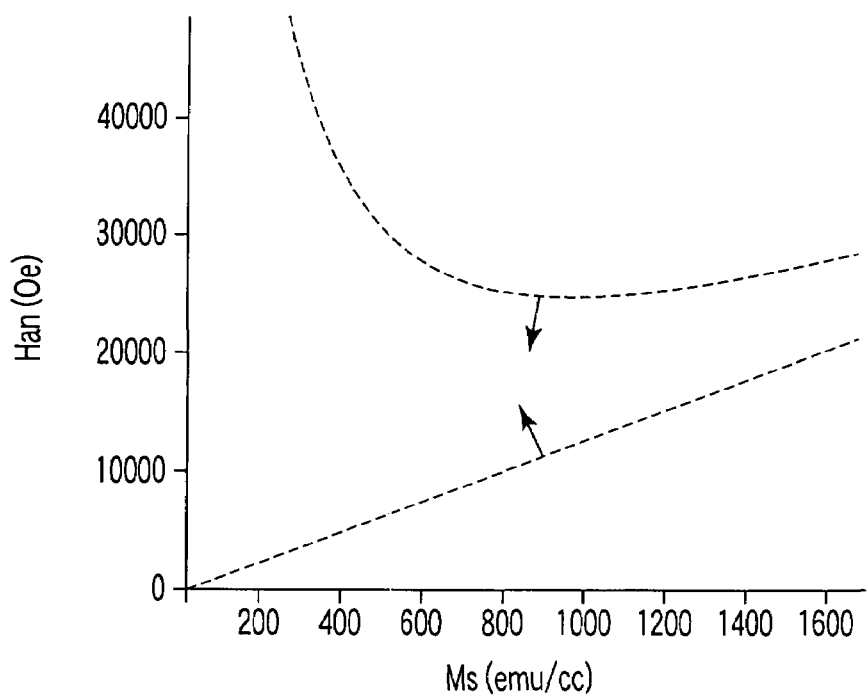
F I G. 2

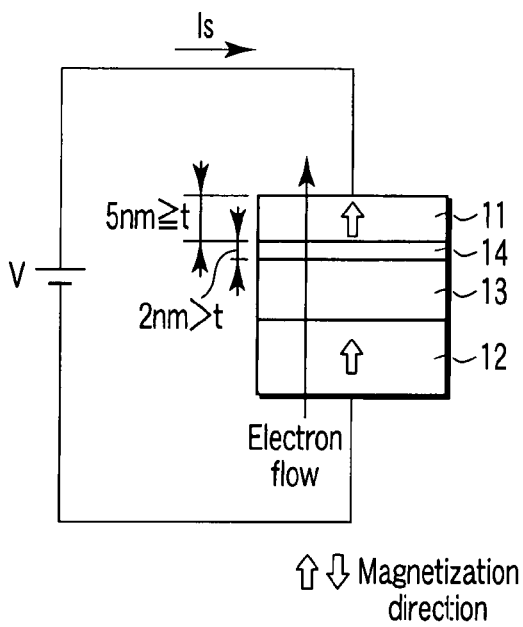 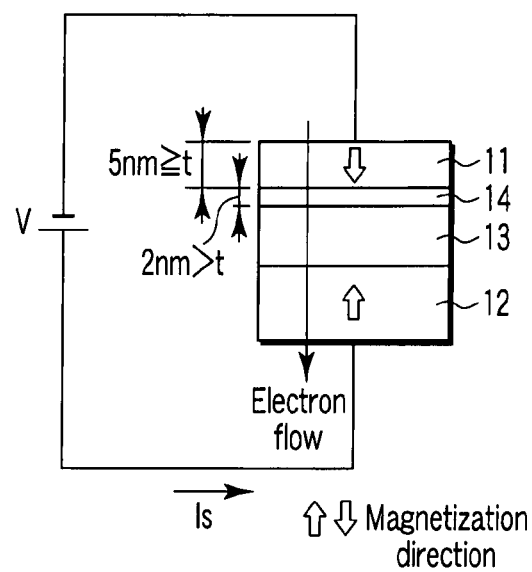
FIG. 5A  FIG. 5B
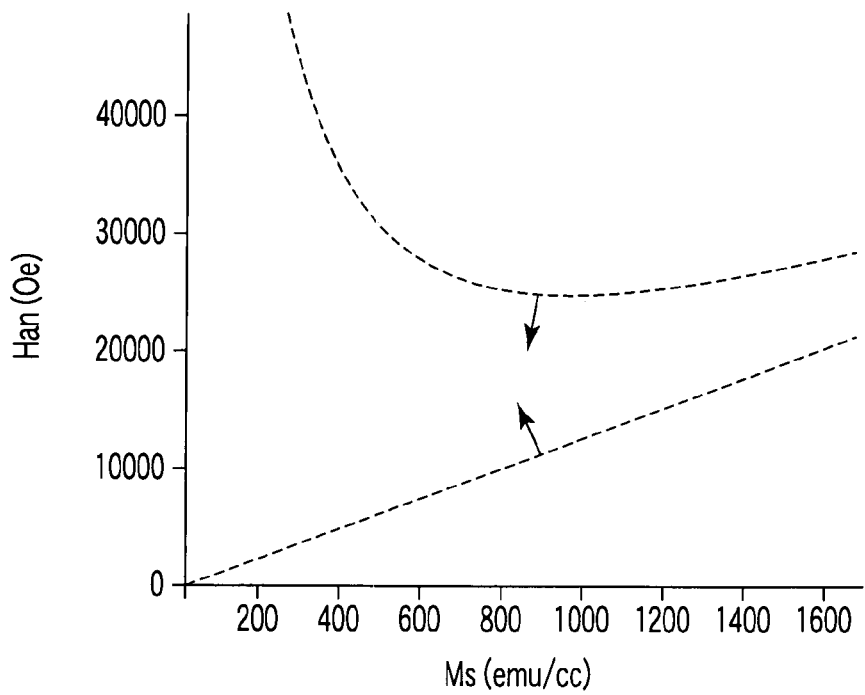
FIG. 6

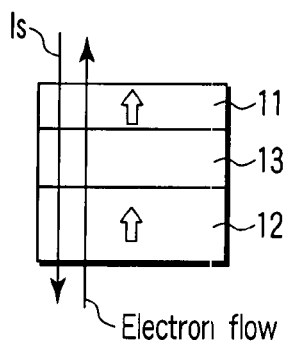 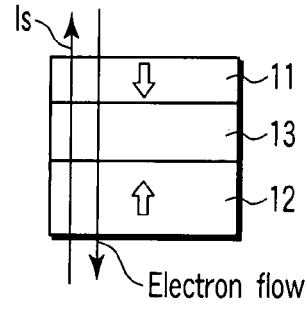
F I G. 10A  F I G. 10B
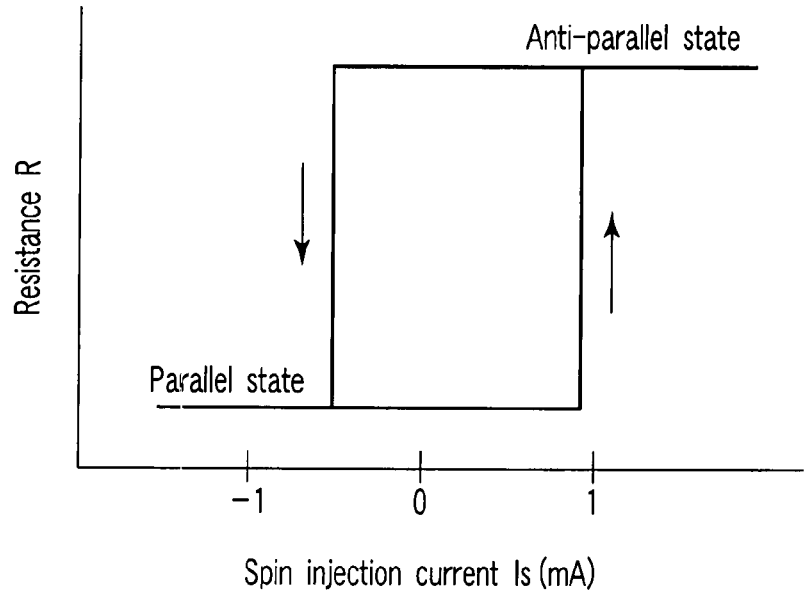
F I G. 11
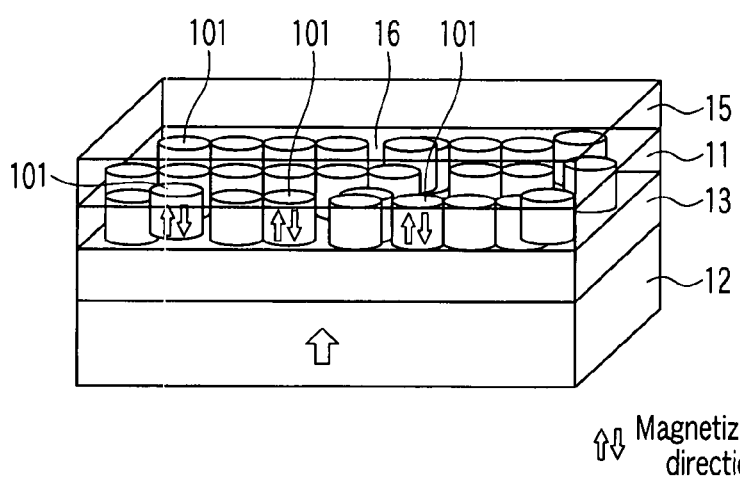
F I G. 12
⇧⇩ Magnetization direction

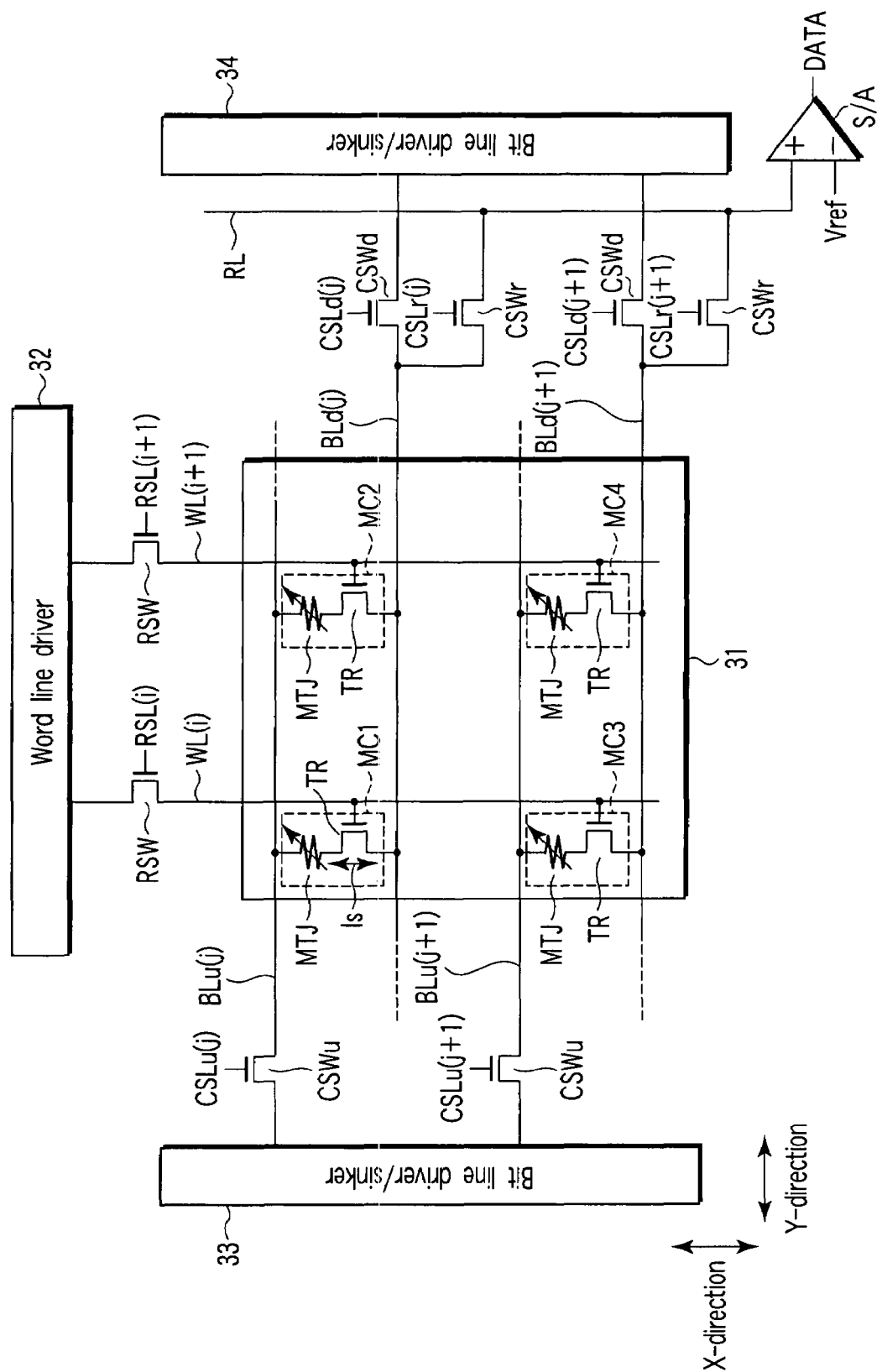
F I G. 21

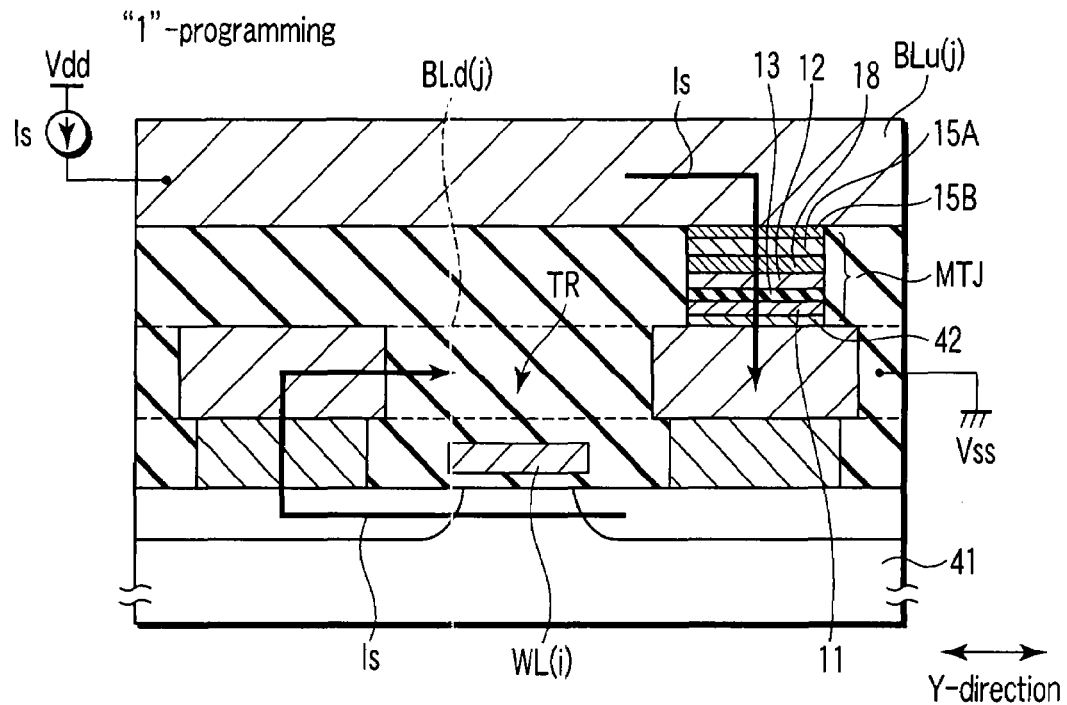
F I G. 22
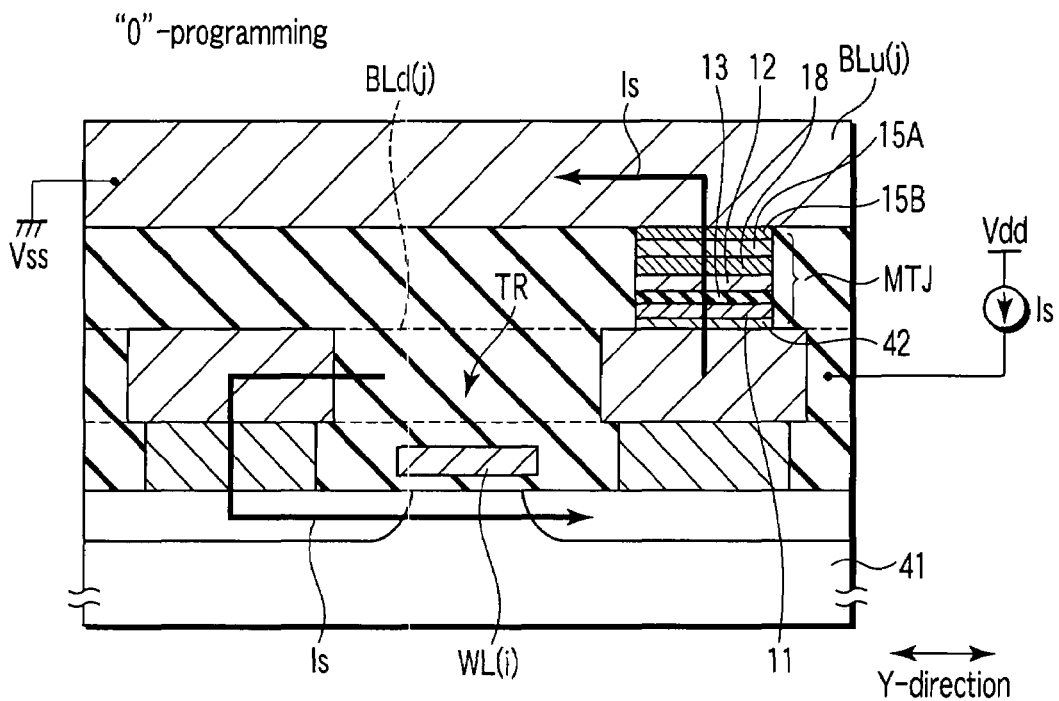
F I G. 23

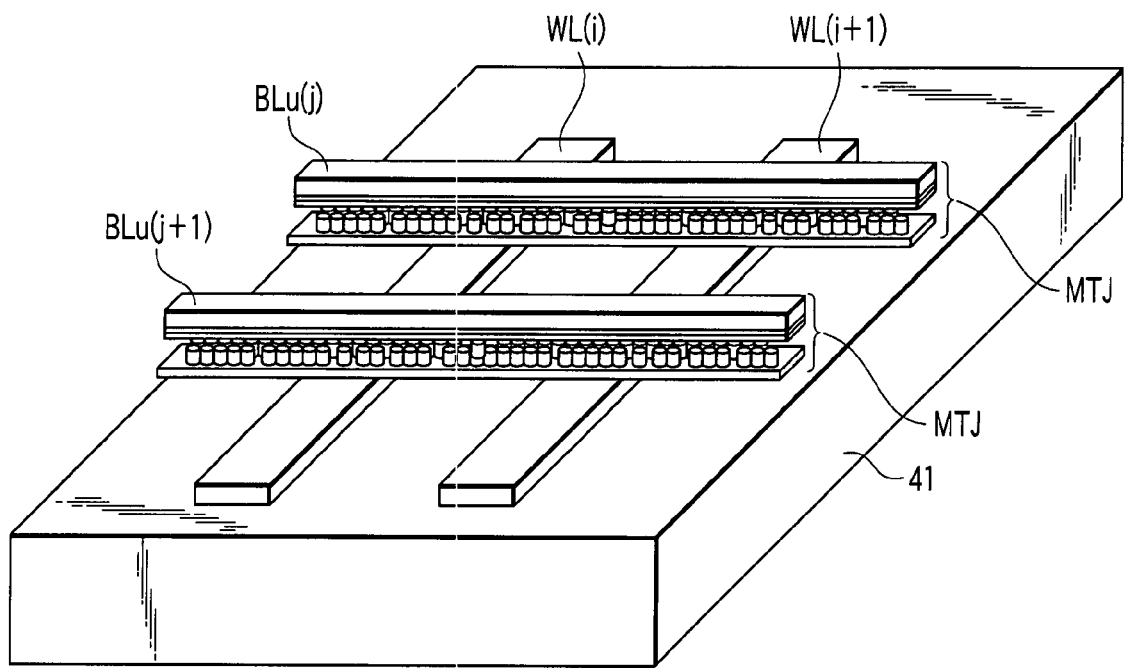
F I G. 28
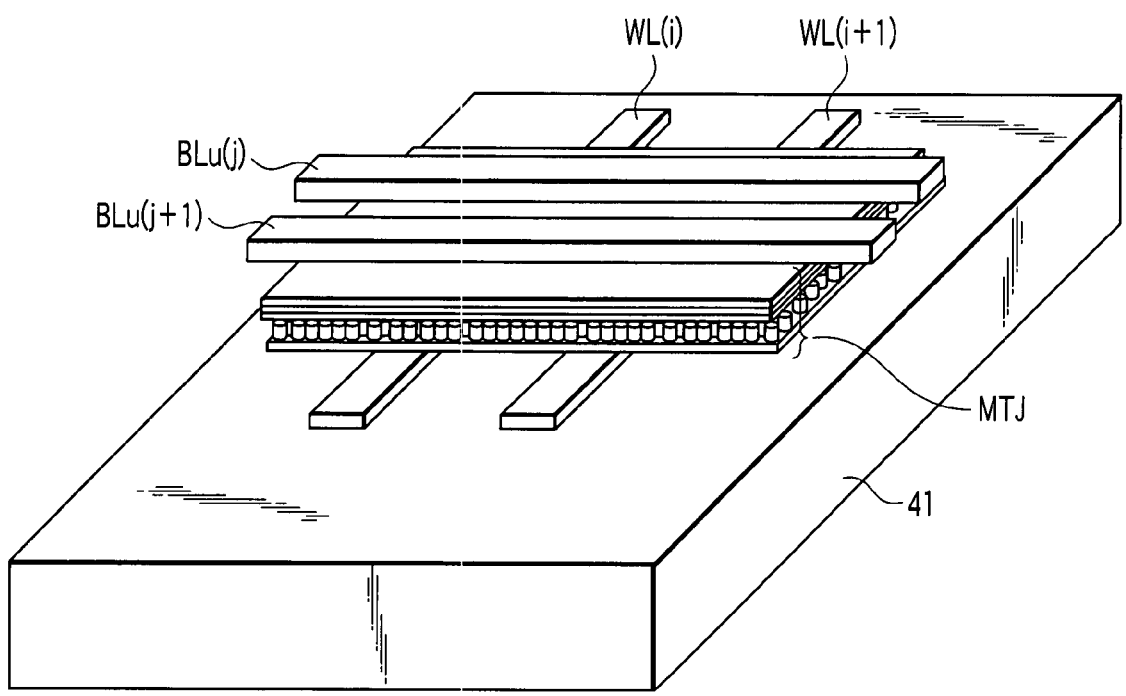
F I G. 29

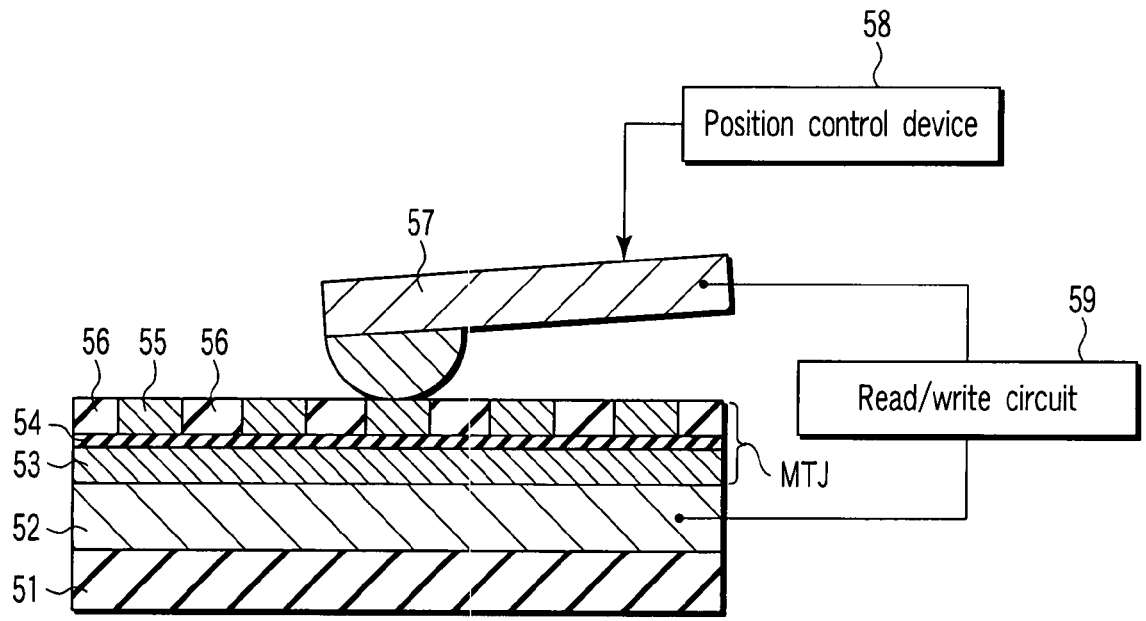
F I G. 32
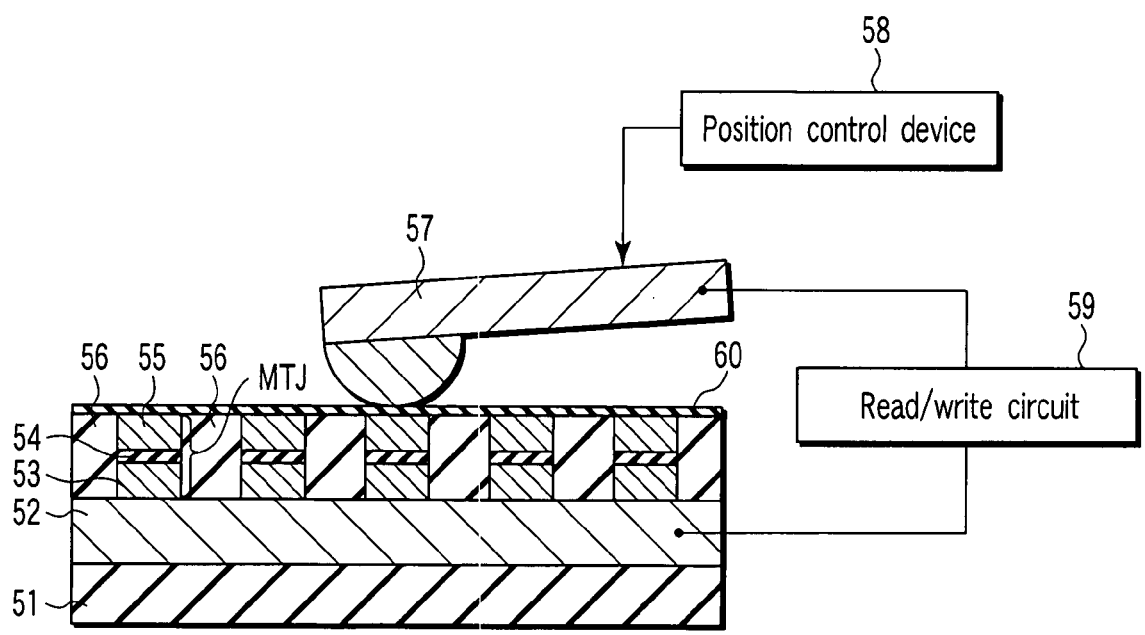
F I G. 33

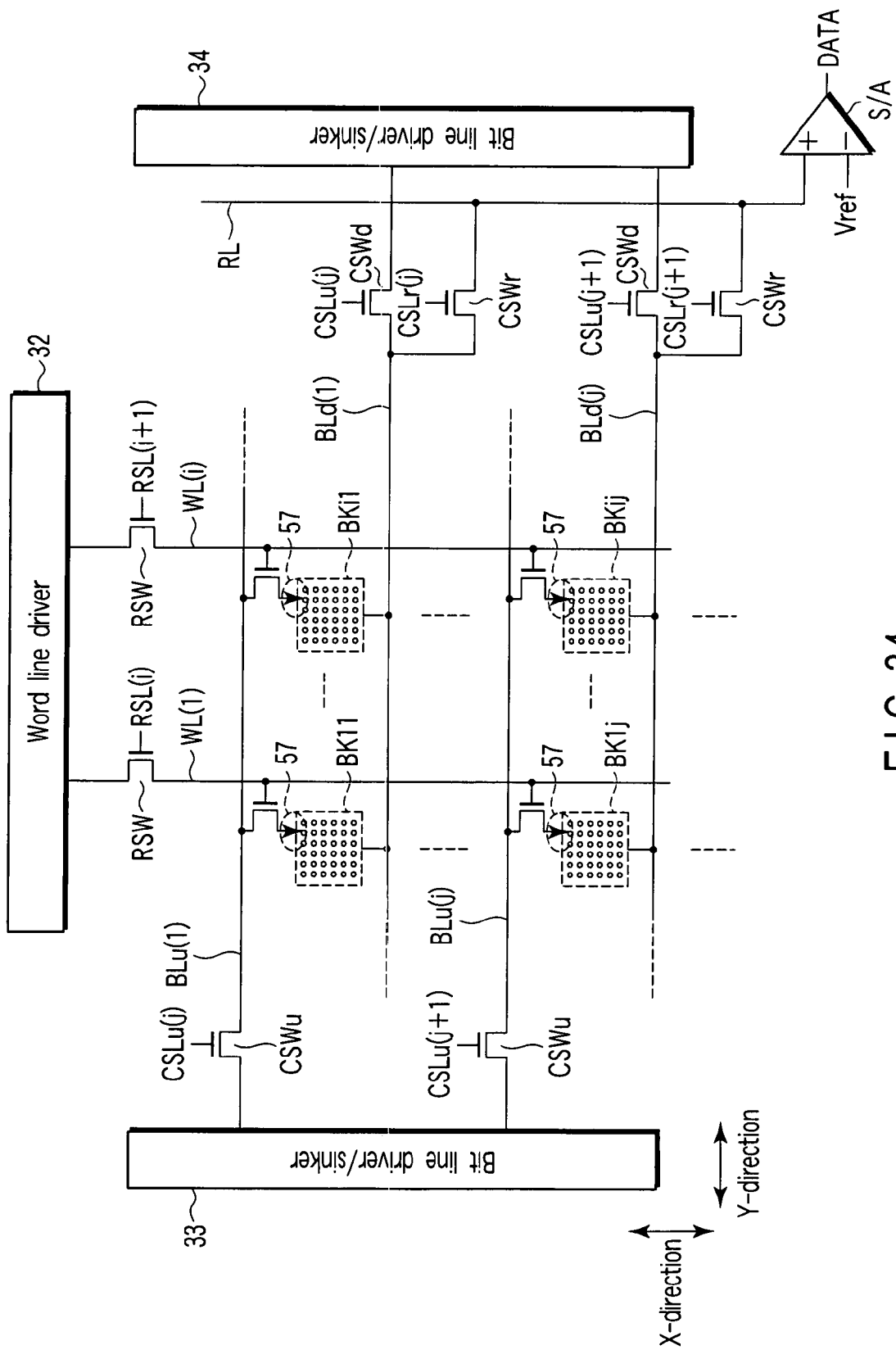
F I G. 34

MAGNETIC RECORDING ELEMENT AND MAGNETIC MEMORY

CROSS-REFERENCE TO RELATED APPLICATIONS

This application is based upon and claims the benefit of priority from prior Japanese Patent Application No. 2006-092230, filed Mar. 29, 2006, the entire contents of which are incorporated herein by reference.

BACKGROUND OF THE INVENTION

1. Field of the Invention

The present invention relates to a magnetic recording element and a magnetic memory utilizing a magnetization reversal by the spin-polarized electrons.

2. Description of the Related Art

In recent years, the research and development of spintronics devices by using the freedom degree of electron spins have been performed actively.

For instance, in a hard disk drive, a magnetization state of a recording medium is controlled by a magnetic field from a magnetic head, while in a magnetic random access memory, a magnetic state of a magnetoresistive element is controlled by a composite magnetic field from two write lines.

Such a method of controlling the magnetization state using the magnetic field has a long history, and it has already become an established technique.

On the other hand, because of the recent progress in nano-technology, the miniaturization of the recording unit of the recording medium and the magnetoresistive element has advanced, and thus there is a need to perform control of the magnetization state locally on a nano scale.

However, it is difficult for the magnetic field to be localized since the magnetic field has characteristics to diverge spatially. For this reason, erroneous writing occurs by the effect of the magnetic field on the recording unit and the magnetoresistive element other than the object of the writing, that is, crosstalk occurs. Further, when attempting to achieve localization of the magnetic field by minimizing the generation source of the magnetic field, the magnetic field with enough magnitude for the magnetization reversal cannot be obtained.

Accordingly, "current induced magnetic switching" in which such a problem does not occur, has been attracting attention (For instance, refer to F. J. Albert, et al., Appl. Phy. Lett. 77, 3809 [2000]).

This is a technique in which a current as a write current is caused to flow in the magnetoresistive element, and then the magnetization reversal is executed while using spin-polarized electrons generated therein. Specifically, the magnetization of a magnetic free layer is inverted by the fact that angular momentum of the spin-polarized electrons is transferred to the angular momentum of a magnetic material serving as the magnetic free layer.

By using such a magnetization reversal technique due to the current (current induced magnetization reversal), the magnetization state is easily controlled locally with nanometer scale, and it is possible to reduce the switching current with miniaturization of the magnetic element. Therefore, it helps realization of spin-electronic devices such as the magnetic recording with high recording density or the magnetic random access memory.

However, there is a challenge in this technique as well. That is, a current density $J_c$ for the magnetization reversal is typically $1 \times 10^7$ A/cm$^2$ or more. Such a large value induces the problem of reliability such that element characteristic degradation.

As countermeasures against this problem, for instance, some proposals have been made such as reducing the value of the saturated magnetization Ms of the magnetic material constituting the magnetoresistive element (for instance, refer to JP-A 2005-93488 [KOKAI], JP-A 2004-193595 [KOKAI]). However, when reducing the saturated magnetization Ms in conventional magnetic recording elements, new problems occur in which thermal fluctuation resistance and magnitude of the reproducing signal output deteriorate.

BRIEF SUMMARY OF THE INVENTION

A magnetic recording element according to an aspect of the present invention comprises a magnetic free layer whose magnetization is variable in accordance with a current direction passing through a film and whose direction of the easy axis of easy axis of magnetization is perpendicular to the film plane, a magnetic pinned layer whose magnetization is fixed to a direction perpendicular to the film plane, and a non-magnetic barrier layer between the magnetic free layer and the magnetic pinned layer, wherein the magnetic free layer has a characteristics that a relation between a saturated magnetization Ms (emu/cc) and an anisotropy field Han (Oe) satisfies Han>12.57 Ms, and Han<1.2 E7 Ms$^-$+12.57 Ms.

A spin FET according to an aspect of the present invention comprises a magnetic free layer whose magnetization is variable and whose direction of the easy axis of magnetization is perpendicular to the film plane, a magnetic pinned layer whose magnetization is fixed to a direction perpendicular to the film plane, a channel region between the magnetic free layer and the magnetic pinned layer, a gate insulating layer on the channel region, and a gate electrode on the gate insulating layer, wherein the magnetic free layer has a characteristics that a relation between a saturated magnetization Ms (emu/cc) and an anisotropy field Han (Oe) satisfies Han>12.57 Ms, and Han<1.2 E7 Ms$^{-1}$+12.57 Ms.

BRIEF DESCRIPTION OF THE SEVERAL VIEWS OF THE DRAWING

FIGS. 1A and 1B are side views showing a structure of a magnetic recording element according to a first embodiment;

FIG. 2 is a view showing a relation between a saturated magnetization Ms and an anisotropy field Han for a magnetic free layer of FIGS. 1A and 1B;

FIGS. 5A and 5B are side views showing a structure of a magnetic recording element according to a third embodiment;

FIG. 6 is a view showing a relation between a saturated magnetization Ms and an anisotropy field Han for a magnetic free layer of FIGS. 5A and 5B;

FIGS. 10A and 10B are views showing the state at the time of writing;

FIG. 11 is a view showing evaluation results of write characteristics;

FIG. 12 is a view showing a structure of a magnetic recording element formed in a second experimental example;

FIG. 21 is a circuit diagram showing a magnetic random access memory as an application example;

FIG. 22 is a cross-sectional view showing the state of a memory cell in "1"-programming;

FIG. 23 is a cross-sectional view showing the state of the memory cell in "0"-programming;

FIG. 28 is a view showing an example of a layout of the magnetic recording element;

FIG. 29 is a view showing an example of a layout of the magnetic recording element;

FIG. 32 is a view showing a modified example of the probe memory of FIG. 30;

FIG. 33 is a view showing a modified example of the probe memory of FIG. 30;

FIG. 34 is a view showing the probe memory with a multi-probe structure as an application example;

DETAILED DESCRIPTION OF THE INVENTION

Figure 3A:
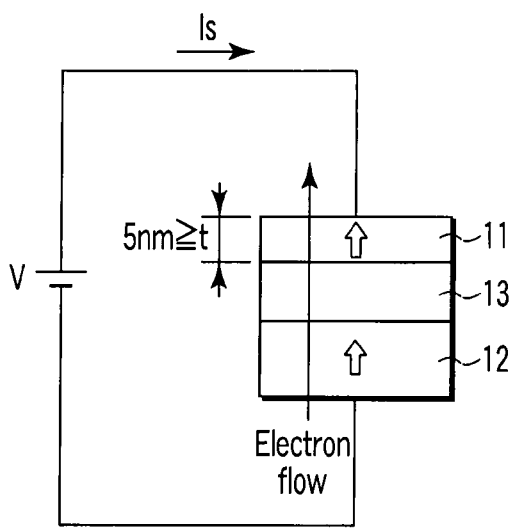
FIGS. 3A and 3B are side views showing a structure of a magnetic recording element according to a second embodiment.

A magnetic recording element and magnetic memory of an aspect of the present invention will be described below in detail with reference to the accompanying drawings.

1. OUTLINE

An example of the present invention premises a magnetization reversal technique (current induced magnetization reversal technique) in which the magnetization reverses because of a spin torque from the spin-polarized electrons. In the technique, in order to reduce the current density for the magnetization reversal without degrading the thermal fluctuation resistance and the MR characteristics, the following configuration is adopted.

First, a direction of easy axis of magnetization of the magnetic free layer is made perpendicular to a film plane. The film plane is a plane of the magnetic free layer.

Here, the film plane means a surface of a film when regarding the magnetic layer as a "film". Therefore, the direction perpendicular to the film plane is a direction in which to laminate a magnetic pinned layer, the magnetic free layer, and non-magnetic barrier layers (for instance, tunnel barrier layer) therebetween.

The magnetic free layer (magnetic material) with a structure is called a perpendicular magnetization film. On the contrary, the magnetic free layer (magnetic material) whose direction of easy axis of magnetization is parallel to the film plane is called an in-plane magnetization film.

The perpendicular magnetization film is better adapted to miniaturize than the in-plane magnetization film, and has a smaller current for the magnetization reversal.

In order to make the direction of easy axis of magnetization of the magnetic free layer perpendicular to the film plane, the relation between the saturated magnetization $Ms$ (emu/cc) of the magnetic material constituting the magnetic free layer and the anisotropy field $Han$ (Oe) may be set to $Han > 12.57\ Ms$. Note that the anisotropy field $Han$ is given by $Han = 2\ Ku/Ms$ while using magnetic anisotropy $Ku$ in the perpendicular direction to the film plane.

Also note that magnetization of the magnetic pinned layer is fixed in the direction perpendicular to the film plane, for instance, by an anti-ferromagnetic layer. Further, magnetization adherence may be performed while using the magnetic material with such a large coercive force as to become a permanent magnet.

Next, in order that the current density for the magnetization reversal is made $2 \times 10^6$ A/cm$^2$ or less, a relation between the saturated magnetization $Ms$ (emu/cc) of the magnetic material constituting the magnetic free layer and the anisotropic field $Han$ (Oe) is set to $Han < 1.2\ E7\ Ms^{-1} + 12.57\ Ms$, and thickness thereof is set to 5 nm or less. This numerical value is found by the experiment, and in order to realize the above described current density, it is necessary to fulfill both the above relation and the thickness simultaneously.

Thus, according to the example of the present invention, it is possible to reduce the current density of the spin injection current for the magnetization reversal to $2 \times 10^6$ A/cm$^2$ or less, which is desirable to avoid a break of a barrier material and to secure operation guarantee of a wiring and a periphery circuit, without minimizing only the value of saturated magnetization $Ms$ of the magnetic material as the magnetic free layer. For this reason, since there is no degradation of the thermal fluctuation resistance and the MR characteristic, it is possible to realize a spin electronics device such as the magnetic memory or the like with a high recording density.

2. EMBODIMENTS

Next, some embodiments considered as the most preferable ones will be described.

(1) First Embodiment

FIGS. 1A and 1B are side views showing a structure of a magnetic recording element of a first embodiment.

A magnetic free layer 11 has a variable magnetization, and a direction of easy axis of magnetization thereof is in a perpendicular direction to the film plane. A magnetic pinned layer 12 has a magnetization fixed in a direction perpendicular to the film plane. A non-magnetic barrier layer 13 is arranged between the magnetic free layer 11 and the magnetic pinned layer 12.

The magnetic free layer 11 is made of a magnetic material in which a relation between the saturated magnetization Ms (emu/cc) and the anisotropy field Han (Oe) satisfies $Han > 12.57\, Ms$ and $Han < 1.2\, E7\, Ms^{-1} + 12.57\, Ms$, and whose thickness is 5 nm or less.

The magnetic pinned layer 12 is constituted by the magnetic material. A magnetization direction of the magnetic pinned layer 12 is fixed because of, for instance, an anti-ferromagnetic layer. The non-magnetic barrier layer 13 is constituted by, for instance, an insulating material as a tunnel barrier layer.

When a switching current Is, which is above the critical current for the magnetization reversal, flows toward the magnetic pinned layer 12 from the magnetic free layer 11, the magnetization state of the magnetic recording element becomes the parallel state where the magnetization direction of the magnetic free layer 11 is parallel to the magnetization direction of the magnetic pinned layer 12.

Further, when the current Is flows toward the magnetic free layer 11 from the magnetic pinned layer 12, the magnetization state of the magnetic recording element becomes an anti-parallel state where the magnetization direction of the magnetic free layer 11 is opposed to the magnetization direction of the magnetic pinned layer 12.

FIG. 2 represents a range specified by the first embodiment.

As to the saturated magnetization Ms (emu/cc) of the magnetic free layer and the anisotropy field Han (Oe), the range indicated by the arrow is a range which is valid as the magnetic recording element of the first embodiment.

According to the first embodiment, it is possible to reduce the current density of the spin injection current for the magnetization reversal without degrading the thermal fluctuation resistance and the MR characteristics.

(2) Second Embodiment

Figure 3B:
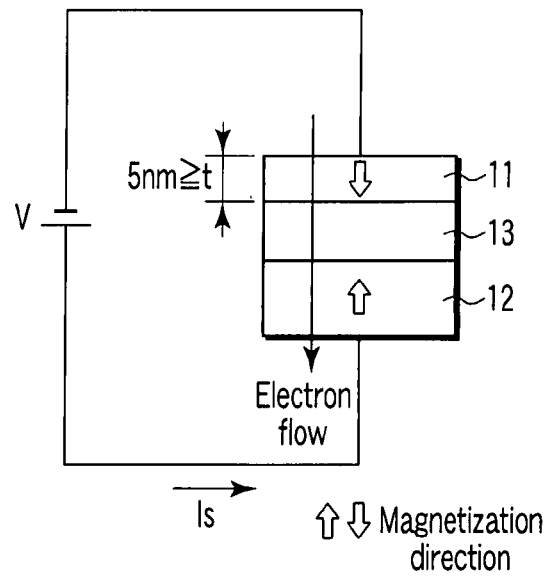

FIGS. 3A and 3B are side views showing a structure of a magnetic recording element of a second embodiment.

A magnetic free layer 11 has a variable magnetization, and a direction of easy axis of magnetization thereof is a perpendicular direction to the film plane. A magnetic pinned layer 12 has a magnetization fixed in a direction perpendicular to the film plane. A non-magnetic barrier layer 13 is arranged between the magnetic free layer 11 and the magnetic pinned layer 12.

The magnetic free layer 11 is made of a magnetic material in which a relation between the saturated magnetization Ms (emu/cc) and the anisotropy field Han (Oe) satisfies $Han > 12.57\, Ms$ and $Han < 1.2\, E7\, Ms^{-1} + 12.57\, Ms$, and whose thickness is 5 nm or less.

Further, the saturated magnetization Ms of the magnetic material constituting the magnetic free layer 11 is set to a value exceeding 600 emu/cc. This value is necessary to obtain an MR ratio 20% or more, the MR ratio being an index indicating the MR characteristic.

The magnetic pinned layer 12 is constituted by the magnetic material. A magnetization direction of the magnetic pinned layer 12 is fixed because of, for instance, an anti-ferromagnetic layer. The non-magnetic barrier layer 13 is constituted by, for instance, an insulating material as a tunnel barrier layer.

When the switching current Is flows toward the magnetic pinned layer 12 from the magnetic free layer 11, the magnetization state of the magnetic recording element becomes a parallel state where the magnetization direction of the magnetic free layer 11 is parallel to the magnetization direction of the magnetic pinned layer 12.

Further, when the switching current Is flows toward the magnetic free layer 11 from the magnetic pinned layer 12, the magnetization state of the magnetic recording element becomes an anti-parallel state where the magnetization direction of the magnetic free layer 11 is opposed to the magnetization direction of the magnetic pinned layer 12.

Figure 4:
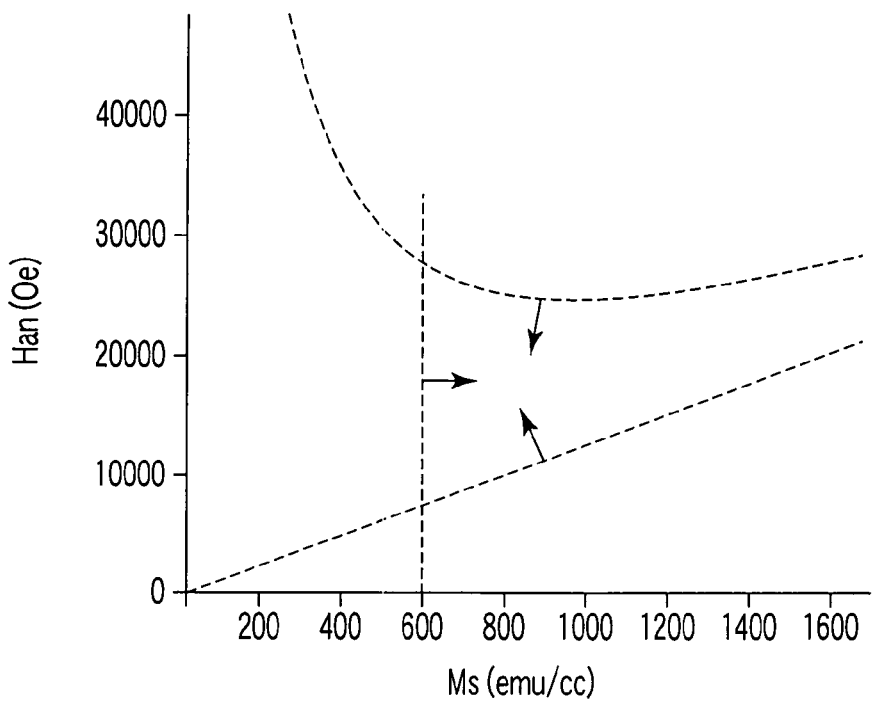
FIG. 4 is a view showing a relation between a saturated magnetization Ms and an anisotropy field Han for a magnetic free layer of FIGS. 3A and 3B.

FIG. 4 represents a range specified by the second embodiment.

As to the saturated magnetization Ms (emu/cc) of the magnetic free layer and the anisotropy field HAN (Oe), the range indicated by the arrow is a range which is valid as the magnetic recording element of the second embodiment.

According to the second embodiment, like the first embodiment, it is possible to reduce the current density of the switching current for the magnetization reversal without degrading the thermal fluctuation resistance and the MR characteristic. Further, it is possible to reduce the current density Jc necessary for the reversal while maintaining the thermal fluctuation resistance by setting the saturated magnetization Ms of the magnetic material constituting the magnetic free layer 11 to a value exceeding 600 emu/cc; the MR ratio of the magnetic recording element becomes large, then the reproducing signal output also becomes large.

(3) Third Embodiment

FIGS. 5A and 5B are side views showing a structure of a magnetic recording element of a third embodiment.

A magnetic free layer 11 has a variable magnetization, and a direction of easy axis of magnetization thereof is a perpendicular direction to the film plane. A magnetic pinned layer 12 has a magnetization fixed in a direction perpendicular to the film plane. A non-magnetic barrier layer 13 is arranged between the magnetic free layer 11 and the magnetic pinned layer 12, and an insertion layer 14 is arranged between the magnetic free layer 11 and the non-magnetic barrier layer 13.

The magnetic free layer 11 is made of a magnetic material in which a relation between the saturated magnetization Ms (emu/cc) and the anisotropy field Han (Oe) satisfies $Han > 12.57\, Ms$ and $Han < 1.2\, E7\, Ms^{-1} + 12.57\, Ms$, and whose thickness is 5 nm or less.

Further, the insertion layer 14 is constituted by the magnetic material, and its saturated magnetization Ms is set to a value exceeding 600 emu/cc. As described in the second embodiment, this value is necessary to make an MR ratio 20% or more, the MR ratio being an index indicating the MR characteristic.

The thickness of the insertion layer 14 is set to 2 nm or less, or more preferably 0.6 nm or less, so as not to change the magnetization direction of the magnetic free layer 11 parallel to the film plane.

The magnetic pinned layer 12 is constituted by the magnetic material. The magnetization direction of the magnetic pinned layer 12 is fixed because of, for instance, an anti-ferromagnetic layer. The non-magnetic barrier layer 13 is constituted by, for instance, an insulating material as a tunnel barrier layer.

When the switching current Is flows toward the magnetic pinned layer 12 from the magnetic free layer 11, the magnetization state of the magnetic recording element becomes a parallel state where the magnetization direction of the magnetic free layer 11 is equal to the magnetization direction of the magnetic pinned layer 12.

Further, when the switching current Is flows toward the magnetic free layer 11 from the magnetic pinned layer 12, the magnetization state of the magnetic recording element becomes an anti-parallel state where the magnetization direction of the magnetic free layer 11 is opposed to the magnetization direction of the magnetic pinned layer 12.

FIG. 6 represents a range specified by the third embodiment.

As to the saturated magnetization Ms (emu/cc) of the magnetic free layer and the anisotropy field Han (Oe), the range indicated by the arrow is a range which is valid as the magnetic recording element of the third embodiment.

According to the third embodiment, like the first embodiment, it is possible to reduce the current density for the magnetization reversal without degrading the thermal fluctuation resistance and the MR characteristic. Further, by setting the saturated magnetization Ms of the magnetic material constituting the insertion layer to a value exceeding 600 emu/cc; the MR ratio of the magnetic recording element becomes large, and the reproducing signal output also becomes large.

Incidentally, the MR ratio of the magnetic recording element is affected by saturated magnetization Ms of the magnetic material in an interface between the magnetic free layer and the non-magnetic barrier layer.

Therefore, instead of the insertion layer, provided that the saturated magnetization Ms of the magnetic free layer is changed continuously or discontinuously inside the magnetic free layer so that the saturated magnetization Ms of the magnetic free layer in the interface between the magnetic free layer and the non-magnetic barrier layer is set to the value exceeding 600 emu/cc, the same effect is obtained.

(4) Fourth Embodiment

Figure 13:
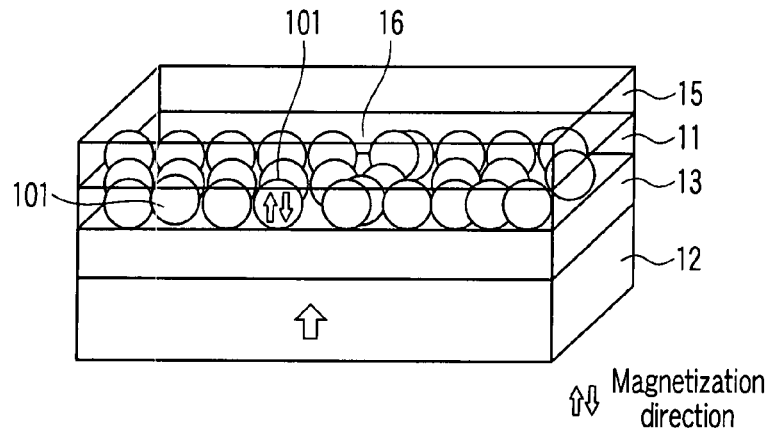
FIG. 13 is a view showing the structure of the magnetic recording element formed in the second experimental example.
Figure 14:
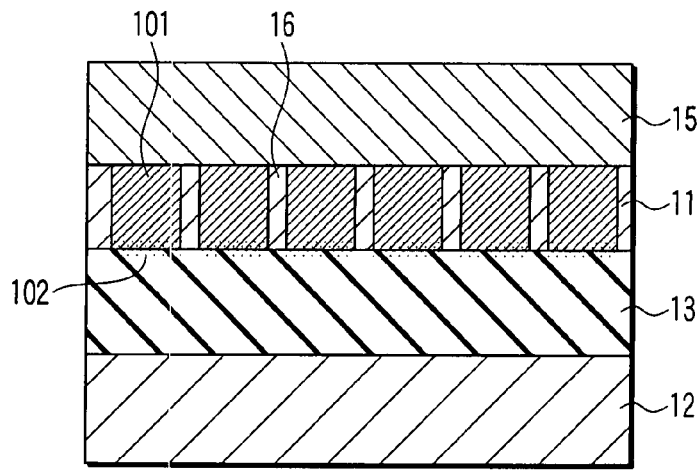
FIG. 14 is a view showing the structure of the magnetic recording element formed in the second experimental example.

FIGS. 12 to 14 are views showing a structure of a magnetic recording element of a fourth embodiment.

A magnetic free layer 11 is composed of magnetic fine particles 101 separated spatially with a non-magnetic material 16, the magnetization of the magnetic fine particles 101 is variable, and the direction of easy axis of magnetization thereof is in a perpendicular direction to the film plane.

A magnetic pinned layer 12 has a magnetization fixed in the direction perpendicular to the film plane. A non-magnetic barrier layer 13 is arranged between the magnetic free layer 11 and the magnetic pinned layer 12. A cap layer 15 is arranged on the magnetic free layer 11.

The magnetic fine particle 101 is made of a magnetic material in which the relation between the saturated magnetization Ms (emu/cc) and the anisotropy field Han (Oe) satisfies Han>12.57 Ms, and Han<1.2 E7 $Ms^{-1}$+12.57 Ms, and whose thickness is 10 nm or less.

The magnetic pinned layer 12 is constituted by the magnetic material. The magnetization direction of the magnetic pinned layer 12 is fixed because of, for instance, an anti-ferromagnetic layer. The non-magnetic barrier layer 13 is constituted by, for instance, an insulating material as a tunnel barrier layer.

When the switching current Is flows toward the magnetic pinned layer 12 from the magnetic free layer 11, the magnetization state of the magnetic recording element becomes a parallel state where the magnetization direction of the magnetic fine particle 101 is parallel to the magnetization direction of the magnetic pinned layer 12.

Further, when the spin injection current Is flows toward the magnetic free layer 11 from the magnetic pinned layer 12, the magnetization state of the magnetic recording element becomes an anti-parallel state where the magnetization direction of the magnetic fine particle 101 is opposed to the magnetization direction of the magnetic pinned layer 12.

The magnetic material from which the magnetic fine particle is formed in the fourth embodiment falls within the range specified by FIG. 2.

As to the saturated magnetization Ms (emu/cc) of the magnetic free layer and the anisotropy field Han (Oe), the range indicated by the arrow is a range which is valid as the magnetic recording element of the fourth embodiment.

According to the fourth embodiment, it is possible to obtain ultra high density by magnetizing each magnetic fine particle independently and defining each magnetic fine particle as recording unit (1 bit). Further, it is possible to reduce characteristic fluctuation by forming one recording unit (1 bit) with a plurality of magnetic fine particles.

In the fourth embodiment, further, as shown in an example of FIG. 14, a hetero atom 102 may exist between the magnetic fine particle and the non-magnetic barrier material. The hetero atom 102 is made of a material which is not included in the material constituting any of the magnetic fine particle 101, the non-magnetic barrier layer 13, and the non-magnetic material 16.

When these materials have thickness of 3-atom layer or less, it is possible to control arrangement of the magnetic fine particle without affecting large influence on the magnetic characteristic.

According to the fourth embodiment, like the first embodiment, it is possible to reduce the current density for the magnetization reversal without degrading the thermal fluctuation resistance and the MR characteristic.

(5) Fifth Embodiment

Figures 15A, 15B:
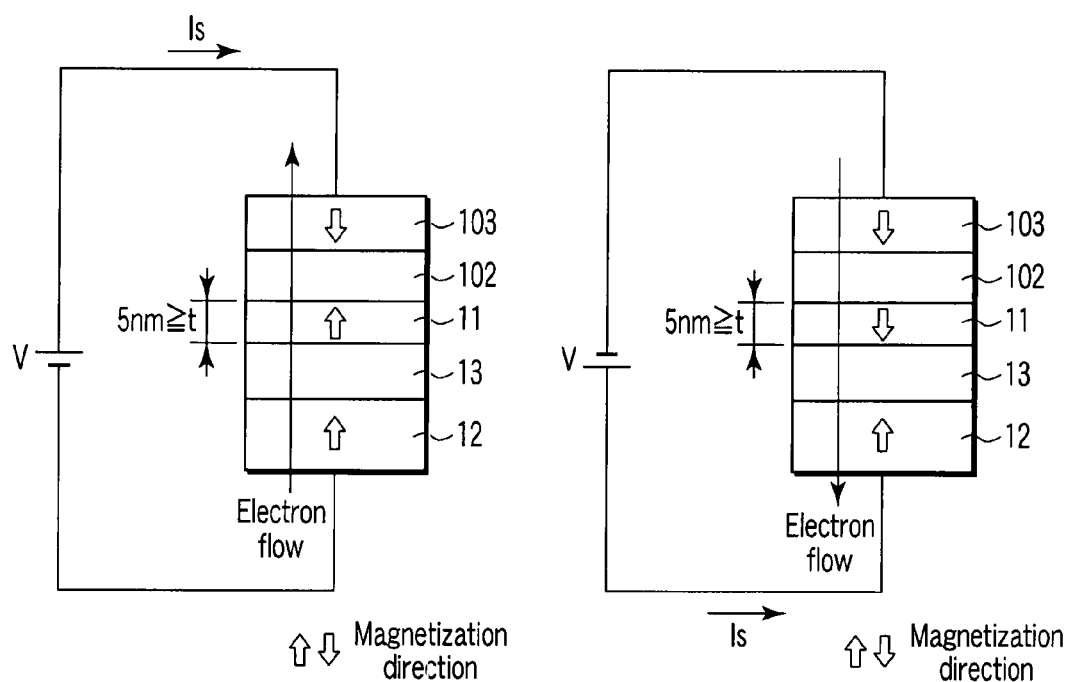
FIGS. 15A and 15B are side views showing a structure of a magnetic recording element according to a fifth embodiment.

FIGS. 15A and 15B are views showing a structure of a magnetic recording element of a fifth embodiment.

A magnetic free layer 11 has a variable magnetization, and a direction of easy axis of magnetization thereof is a perpendicular direction to the film plane. A magnetic pinned layer 12 has a magnetization fixed in a direction perpendicular to the film plane. A non-magnetic barrier layer 13 is arranged between the magnetic free layer 11 and the magnetic pinned layer 12. There is provided a non-magnetic conductive or insulating layer 102 on an opposite side surface to the non-magnetic barrier layer 13 of the magnetic free layer 11. Further, it is characterized by having a second magnetic pinned layer 103 whose magnetization is fixed in a direction perpendicular to the film plane, the second magnetic pinned layer 103 being provided on an opposite side plane to the magnetic free layer 11 of the non-magnetic conductive or insulating layer 102.

The magnetic free layer 11 is made of a material in which a relation between the saturated magnetization Ms (emu/cc) and the anisotropy field Han (Oe) satisfies Han>12.57 Ms and Han<1.2 E7 $Ms^{-1}$+12.57 Ms, and whose thickness is 5 nm or less.

The magnetic free layer 11, in addition to the case of being composed of the layer with continuous material, as shown in the fourth embodiment, may be formed with the fine particle in which the magnetization is variable and the direction of easy axis of magnetization is in a perpendicular direction to the film plane.

The magnetic pinned layer 12 and the second magnetic pinned layer 103 are constituted by the magnetic material. The magnetization direction of the magnetic pinned layer 12 and the second magnetic pinned layer 103 is fixed, for instance, by an anti-ferromagnetic layer. At this time, when fixing each magnetization of the magnetic pinned layer 12 and the second magnetic pinned layer 103 to be anti-parallel with each other, it is possible to improve reversal efficiency and then reduce the current density for the magnetization reversal.

The non-magnetic barrier layer 13 is composed of an insulating material as, for instance, a tunnel barrier layer.

The non-magnetic conductive or insulating layer 102 is composed of conductive metal including one or more elements selected from, for instance, Cu (copper), Au (gold), Ag (silver) and Al (aluminum). Alternatively, the non-magnetic layer 102 is composed of non-mangetic tunnel barrier material including one or more compounds selected from, for instance, MgO, $Al_2O_{3-x}$, $TiO_x$, $SiO_x$, ZnOx and Si—N.

When the switching current Is flows toward the magnetic pinned layer 12 from the second magnetic pinned layer 103, the magnetization state of the magnetic recording element becomes a parallel state where the magnetization direction of the magnetic free layer 11 is parallel to the magnetization direction of the magnetic pinned layer 12.

Further, when the switching current Is flows toward the second magnetic pinned layer 103 from the magnetic pinned layer 12, the magnetization state of the magnetic recording element becomes an anti-parallel state where the magnetization direction of the magnetic free layer 11 is opposed to the magnetization direction of the magnetic pinned layer 12.

As to the saturated magnetization Ms (emu/cc) of the magnetic free layer and the anisotropy field Han (Oe), the range indicated by the same arrow as in FIG. 2 is a range which is valid as the magnetic recording element of the fifth embodiment.

According to the fifth embodiment, it is possible to obtain ultra high density by magnetizing each magnetic fine particle independently and defining each magnetic fine particle as recording unit (1 bit). Further, it is possible to reduce characteristic fluctuation by forming one recording unit (1 bit) with a plurality of magnetic fine particles.

According to the fifth embodiment, like the first embodiment, it is possible to reduce the current density of the switching current for the magnetization reversal without degrading the thermal fluctuation resistance and the MR characteristic.

3. Material Example

There will be described below the material examples for realizing the magnetic recording element of the first to fifth embodiments.

(1) Magnetic Free Layer and Magnetic Pinned Layer

The magnetic free layer and the magnetic pinned layer are composed of the magnetic metals including one or more elements selected from the group consisting of Fe (iron), Co (cobalt), Ni (nickel), Mn (manganese) and Cr (chrome).

As to the magnetic free layer, when constituting an alloy of combining one or more elements selected from the group consisting of Fe, Co, Ni, Mn and Cr and one or more elements elected from the group consisting of Pt (platinum), Pd (palladium), Ir (iridium), Ru (ruthenium) and Rh (rhodium), the value of the anisotropy field Han of the magnetic free layer becomes large, and the value of the saturated magnetization Ms of the magnetic free layer is easily set to 600 emu/cc or more.

The value of the anisotropy field Han of the magnetic free layer can be adjusted by composition of the magnetic material constituting the magnetic free layer or crystal regularity due to heat treatment.

The magnetic free layer and the magnetic pinned layer may be constituted by, for instance, an amorphous alloy including a rare earth-transition metal, such as TbFeCo, GdFeCo, or the like, or a laminated structure such as Co/Pt, Fe/Pt, or Co/Pd.

The magnetic material constituting the magnetic free layer and the magnetic pinned layer can be a continuous magnetic body, or composite structure in which the fine particles composed of the magnetic body are separated out in a matrix shape inside a non-magnetic body. In particular, the composite structure including the fine particles is preferable to realize high density because it is better suited for miniaturization of the elemental device.

The shape of the magnetic fine particle, for instance, as shown in FIGS. 12 to 14, is columnar-shape or sphere.

As to the composite structure, when the non-magnetic body is a high resistance material of oxides such as $Al_2O_{3-x}$, $MgO_{1-x}$, SiOx, ZnOx, TiOx, or the like, the switching current converges on the fine particle, and thus the magnetization reversal becomes possible with the lower current density. Further, particularly, provided that the non-magnetic material is the same material as the non-magnetic barrier layer, crystal control of the fine particle and magnetic anisotropy control become easy.

(2) Insertion Layer

The insertion layer is composed of, for instance, one of Fe (iron), Co (cobalt) and Ni (nickel), or an alloy including one element selected from the group consisting of Fe (iron), Co (cobalt), Ni (nickel), Mn (manganese) and Cr (chrome).

Further, the insertion layer may be a soft magnetic material such as CoNbZr, FeTaC, CoTaZr, FeAlSi, FeB, CoFeB, or the like, Heusler alloy such as $Co_2MnSi$ or the like, oxide or nitride of half metal such as $CrO_2$, $Fe_3O_4$, $La_{1-x}Sr_xMnO_3$, or the like, or a magnetic semiconductor.

(3) Non-Magnetic Barrier Layer

For the non-magnetic barrier layer, it is possible to use the insulating material as the tunnel barrier layer for obtaining a large reproducing signal output because of tunnel magneto resistive (TMR) effect at the time of reading.

Specifically, it is possible to constitute the non-magnetic barrier layer with oxide, nitride or fluoride including at least one element selected from the group consisting of Al (aluminum), Ti (titanium), Zn (zinc), Zr (zirconium), Ta (tantalum), Co (cobalt), Ni (nickel), Si (silicon), Mg (magnesium) and Fe (iron).

In particular, it is preferable for the non-magnetic barrier layer to be composed of $Al_2O_{3-x}$ (alumina), MgO (magnesium oxide), $SiO_{2-x}$, Si—O—N, Ta—O, Al—Zr—O, ZnOx, TiOx or a semiconductor (GaAlAs or the like) with a large energy gap.

Further, as for the non-magnetic barrier layer, it is possible to obtain large reproducing signal output by constituting the layer from a nano contact magneto resistive (MR) material in which the magnetic material is inserted in a pinhole provided at the insulating body, or a CCP(current-confiend-pass)-CPP (current-perpendicular-to-plane)-MR material in which Cu is inserted in a pinhole provided at the insulating body.

When the non-magnetic barrier layer is the tunnel barrier layer, it is preferable to obtain the large reproducing signal output that its thickness falls within the value range of 0.2 nm to 2.0 nm. Similarly, when the non-magnetic barrier layer is the nano contact MR material, it is preferable to obtain the large reproducing signal output that its thickness falls within the value range of 0.4 nm to 40 nm.

4. Experiment Examples

There will be described experiment examples in which samples are prepared and their characteristics are evaluated.

(1) First Experiment Example

Figure 7:
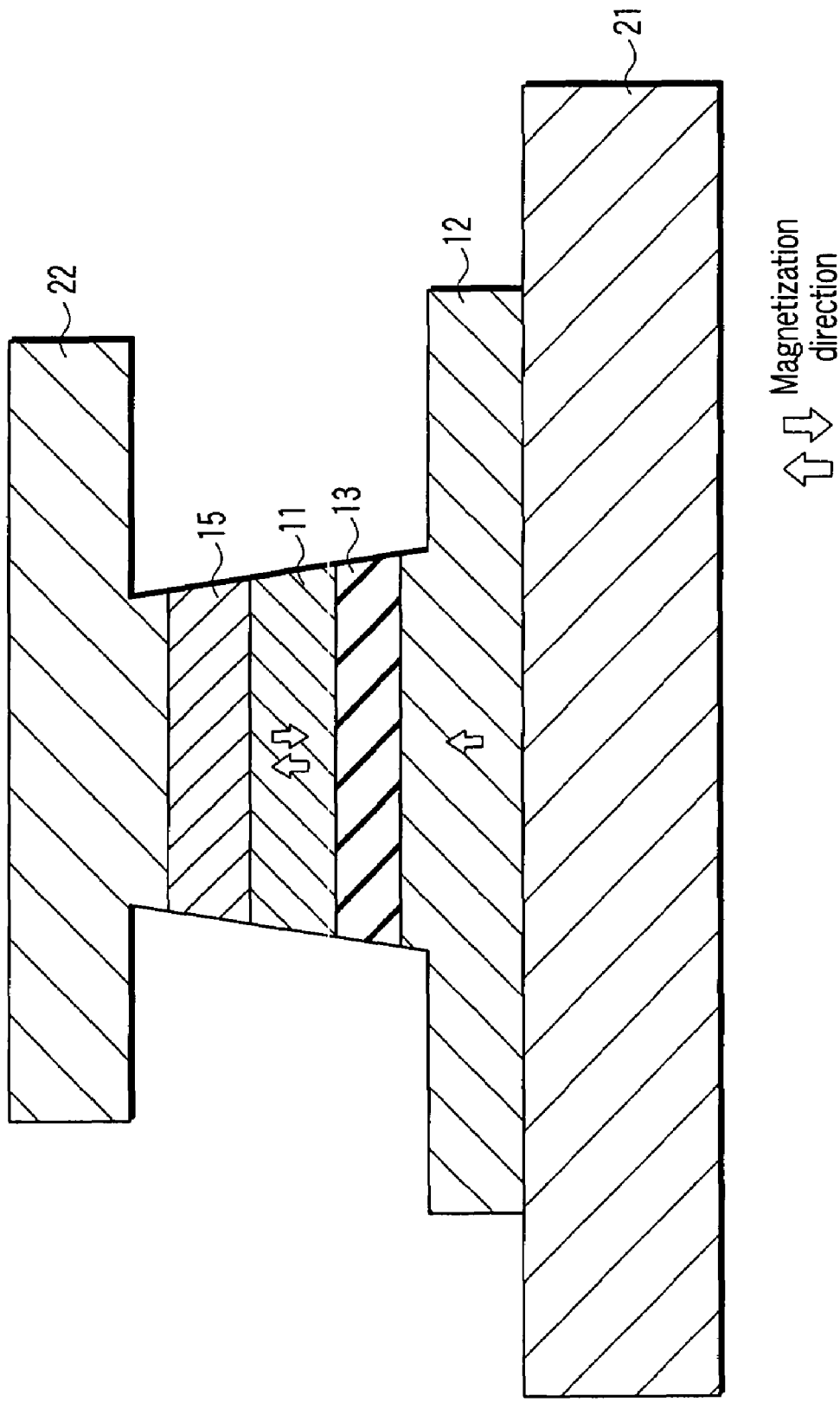
FIG. 7 is a cross-sectional view showing the structure of the magnetic recording element formed in a first experimental example.

FIG. 7 shows a structure of a magnetic recording element formed in a first experiment example.

The magnetic recording element is composed of a laminated structure of a magnetic free layer 11, a magnetic pinned layer 12 and a non-magnetic barrier layer 13 therebetween and is arranged between a lower electrode 21 and an upper electrode 22. Further, a cap layer 15 with thickness of 10 nm or less is arranged between the magnetic free layer 11 and the upper electrode 22.

The cap layer 15 can be composed of, for instance, oxides such as Ta, Al, Mg, Fe, or the like, or a laminated structure of a non-magnetic metal such as Cu, Ag, Au, or the like, and an oxide such as Ta, Al, Mg, Fe, or the like to protect the magnetic recording element.

It is more preferable for the cap layer 15 to be composed of one selected from the group of oxide, nitride and fluoride with thickness of 1 nm or less.

The cap layer 15, when the low current density for the magnetization reversal is realized, may be composed of the non-magnetic metals such as Ru, Cu, Ag, Au, Ta, or the like.

Note that the magnetic pinned layer 12, in FIG. 7, has pillar shape in only its upper part, however, it may be preferable for the magnetic pinned layer to have narrow width to its lower part so as to have the pillar shape to the lower part.

As shown in Table 1, there are 17 kinds of samples. In common thereto, the magnetic pinned layer 12 is composed of FePt-regulated alloy, while, the non-magnetic barrier layer 13 is composed of MgO. The magnetic free layer is composed of Fe—Pt alloy, Fe—Co—Pt alloy, Co—Pt alloy, Co—Cu—Pt alloy, Co—Ph—Pt alloy, or the like.

Figure 8:
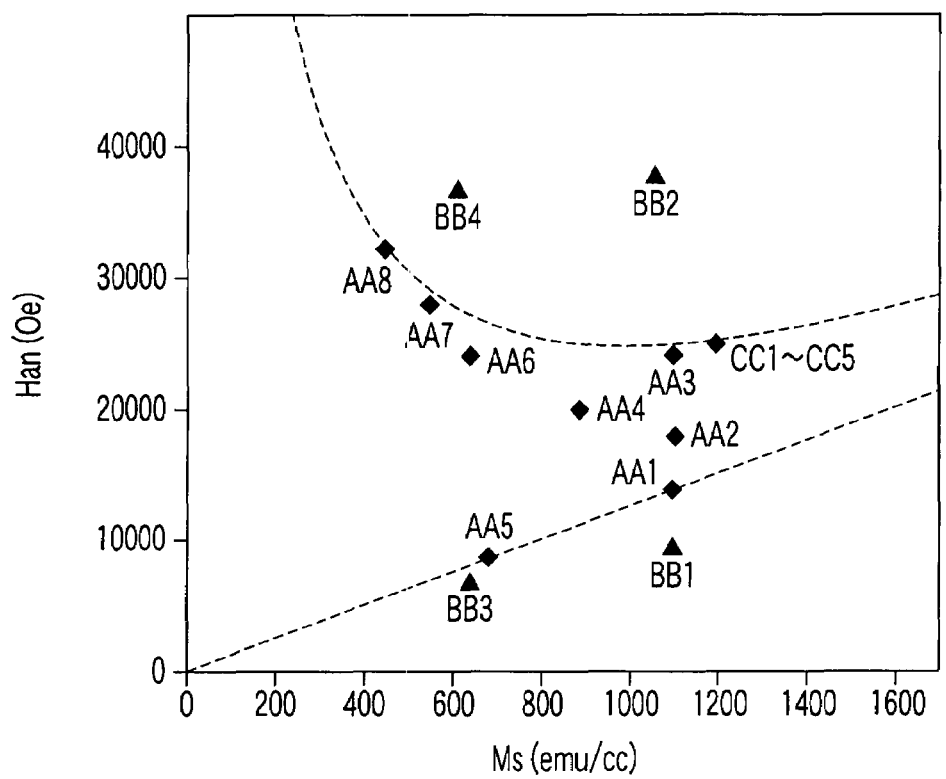
FIG. 8 is a view showing a relation between a saturated magnetization Ms and an anisotropy field Han of a sample of the first experimental example.

FIG. 8, deviate from the range of the conditions represented in the first embodiment.

On the other hand, in samples CC1 to CC5, as shown in FIG. 8, relation between Ms and Han is within the range of the conditions represented in the embodiment 1, however, the magnetic free layer 11 is composed of FeCoPt with different thickness.

These samples are manufactured under the following procedure.

First, after forming the lower electrode 21 on a wafer, the wafer is arranged inside an ultrahigh vacuum sputtering device, and the magnetic pinned layer 12, the non-magnetic barrier layer 13, the magnetic free layer 11 and the cap layer 15 are deposited sequentially on the lower electrode 21. An Au(001) buffer layer or Pt(001) buffer layer may be used, for instance, as the lower electrode 21. A magnetization pinned layer composed of the FePt-regulated alloy can grow on the substrate-heated buffer layer. After that, the substrate temperature decreases to room temperature to prepare an MgO film, after which the alloy material for forming the magnetic free layer is caused to grow within the range of the substrate temperature of 350° C. to 700° C. to obtain the magnetic free layer with desired Ms and Han. Further, the cap layer is prepared on these films. The Han of the magnetic free layer can be changed according to change of growth temperature of the alloy as this example, while it can be changed by a post-annealing temperature.

Next, a mask is prepared while performing EB exposure by applying an electron beam (EB) resist. The shape of the mask, for instance, is oval of 70 nm×100 nm, and a longitudinal direction along its long sides is in parallel to a direction of the magnetic anisotropy of the magnetic free layer.

TABLE 1

| Sample number | Structure (magnetic pinned layer/non-magnetic barrier layer/ magnetic free layer) | Thickness of magnetic free layer | Ms (emu/cc) | Han (Oe) | Jc(A/cm$^2$) (Jc is average of absolute values on positive side and negative side) |
|---|---|---|---|---|---|
| AA1 | FePt/MgO/Fe—Pt | 4 | 1101 | 1.40E+04 | 2.5E+05 |
| AA2 | FePt/MgO/Fe—Pt | 3 | 1107 | 1.80E+04 | 1.0E+06 |
| AA3 | FePt/MgO/Fe—Pt | 1.5 | 1105 | 2.40E+04 | 2.0E+06 |
| AA4 | FePt/MgO/Fe—Co—Pt | 2 | 890 | 2.00E+04 | 1.8E+06 |
| AA5 | FePt/MgO/Co—Pt | 5 | 680 | 9.00E+03 | 5.1E+05 |
| AA6 | FePt/MgO/Co—Pt | 5 | 640 | 2.40E+04 | 2.0E+06 |
| AA7 | FePt/MgO/Co—Cu—Pt | 2 | 550 | 2.79E+04 | 1.9E+06 |
| AA8 | FePt/MgO/Co—Cu—Pt | 2 | 450 | 3.20E+04 | 1.2E+06 |
| BB1 | FePt/MgO/Fe—Pt | 3 | 1100 | 1.00E+04 | 1.2E+07 |
| BB2 | FePt/MgO/Fe—Pt | 3 | 1060 | 3.80E+04 | 1.2E+08 |
| BB3 | FePt/MgO/Co—Pt | 5 | 640 | 7.00E+03 | 2.1E+07 |
| BB4 | FePt/MgO/Co—Ph—Pt | 5 | 614 | 3.70E+04 | 1.5E+08 |
| CC1 | FePt/MgO/Fe—Co—Pt | 1.5 | 1200 | 2.50E+04 | 4.4E+05 |
| CC2 | Same as above | 3 | 1200 | 2.50E+04 | 1.2E+06 |
| CC3 | Same as above | 5 | 1200 | 2.50E+04 | 1.90E+06 |
| CC4 | Same as above | 7 | 1200 | 2.50E+04 | 2.5E+06 |
| CC5 | Same as above | 9 | 1200 | 2.50E+04 | 3.8E+06 |

Samples AA1 to AA8 are the magnetic recording elements according to the examples of the present invention, and as shown in FIG. 8, are within the range of the conditions represented in the first embodiment. Further, the film thickness of the magnetic free layer is 5 nm or less.

To the contrary, samples BB1 to BB4 are the magnetic recording elements as comparison examples, and as shown in Further, by utilizing an ion milling device, the magnetic free layer 11, the magnetic pinned layer 12, the non-magnetic barrier layer 13 and the cap layer 15 existing in the region not coated with the mask are etched. Here, etching amount can be grasped accurately by performing mass analysis while introducing sputtered particles into a quadrupole spectrograph using differential exhaust.

The magnetic recording element is completed by the etching.

After that, the mask is removed, and further, $SiO_2$ is prepared which completely covers the magnetic recording element. Further, a surface of the $SiO_2$ is leveled by the ion milling to expose an upper surface of the cap layer 15 from the $SiO_2$. Then, finally, the upper electrode 22 is prepared on the cap layer 15.

To these samples, the current is caused to flow in the lamination direction of the magnetic recording element to monitor necessary switching current density for reversing the magnetization of the magnetic free layer.

As a result, in the samples AA1 to AA8, the switching current density Jc, as shown in Table 1, becomes $2\times10^6$ $A/cm^2$ or less, the switching current density Jc being obtained in such a way that an absolute value of the switching current density when reversing from anti-parallel to parallel and an absolute value of the switching current density when reversing from parallel to anti-parallel are averaged. To the contrary, in the samples BB1 to BB4, the switching current density becomes a value exceeding $2\times10^6$ $A/cm^2$ adequately. Note that the switching current density Jc described in the present specification, unless otherwise described, is defined with the value which is obtained in such a way that an absolute value of the switching current density when reversing from anti-parallel to parallel and an absolute value of the switching current density when reversing from parallel to anti-parallel are averaged as described above.

Figure 9:
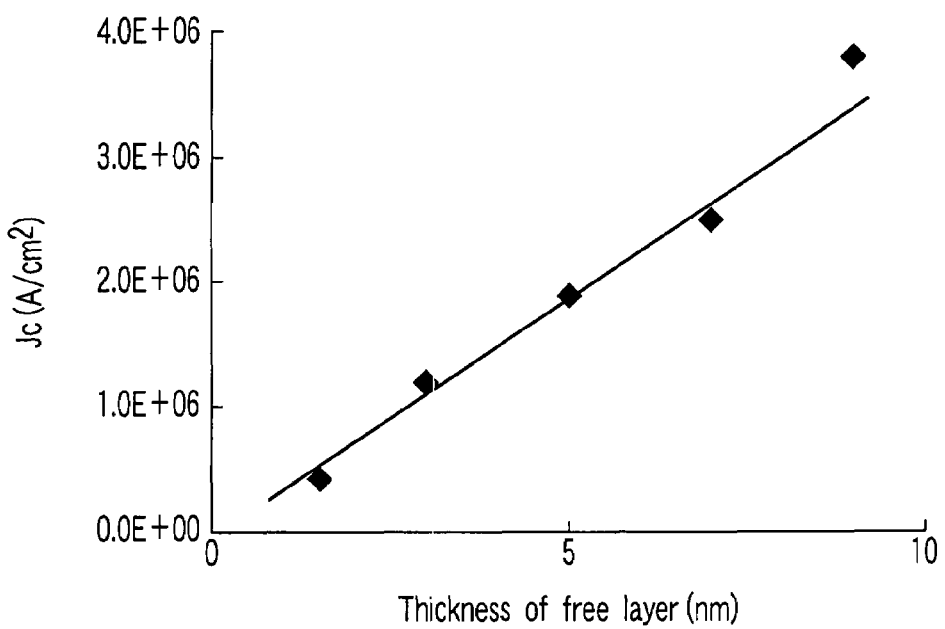
FIG. 9 is a view showing a relation between thickness of the magnetic free layer and a switching current density.

Further, in the samples CC1 to CC5, as shown in FIG. 9, the switching current density Jc is approximately proportional to thickness of the magnetic free layer, and it is found that desired thickness of the magnetic free layer is 5 nm or less, to realize the switching current density of $2\times10^6$ $A/cm^2$ for obtaining suitable characteristic.

As apparent from this result, according to the example of the invention, it is confirmed that it is possible to reduce the current density of the switching current to $2\times10^6$ $A/cm^2$ or less. Further, the same tendency was obtained in the case that $Al_2O_{3-x}$, $SiO_{2-x}$, TiOx, ZnOx are utilized as the non-magnetic barrier layer.

FIG. 11 shows evaluation results of write characteristic of the sample A1.

First, as shown in FIGS. 10A and 10B, the switching current Is is caused to flow under the condition of an external magnetic field being zero to determine the magnetization direction of residual magnetization of the magnetic free layer 11.

When the switching current Is flows toward the magnetic pinned layer 12 from the magnetic free layer 11, the magnetization state of the magnetic recording element becomes a parallel state where the magnetization direction of the magnetic free layer 11 becomes the same as the magnetization direction of the magnetic pinned layer 12.

Further, when the switching current Is flows toward the magnetic free layer 11 from the magnetic pinned layer 12, the magnetization state of the magnetic recording element becomes an anti-parallel state where the magnetization direction of the magnetic free layer 11 becomes opposite to the magnetization direction of the magnetic pinned layer 12.

Next, resistance R in the parallel/anti-parallel states is measured while making a read current flow into the magnetic recording element. As a result, as shown in FIG. 11, there is obtained relation between the switching current Is and the resistance R of the magnetic recording element.

According to the evaluation, there has been confirmed that the magnetization reversal is performed precisely with the small switching current density.

Incidentally, provided that the minimum value of the necessary current to invert the magnetization of the magnetic free layer is a critical current Ic, the writing can be performed with a current of the critical current Ic or more. As to the read current, its value is made smaller than the critical current Ic to prevent the erroneous writing at the time of reading.

(2) Second Experiment Example

FIGS. 12 to 14 show a structure of a magnetic recording element formed experimentally in a second experiment example.

The magnetic recording element is composed of a laminated structure of a magnetic free layer 11, a magnetic pinned layer 12 and a non-magnetic barrier layer 13 therebetween. The characteristic of the magnetic recording element is that the magnetic free layer 11 is composed of aggregation of a plurality of magnetic fine particles 101 separated by a non-magnetic material 16, and the magnetization direction of the respective magnetic fine particles 101 is determined independently.

Here, it is preferable that the non-magnetic material 16 exists in a crystal grain boundary of the magnetic fine particle 101 constituting the magnetic free layer 11 in terms of the manufacturing process. The non-magnetic material 16 is composed of, for instance, materials including oxygen such as $MgO_x$, $Al_2O_{3-x}$, $SiO_2$, or the like. In particular, in the case that the non-magnetic material 16 is composed of the same material as the non-magnetic barrier layer 13, control of crystal orientation becomes easy, which is preferable in terms of the manufacturing and the characteristic of the magnetic anisotropy.

The cap layer 15 with thickness of 10 nm or less is arranged on the magnetic free layer 11.

The cap layer 15 can be composed of, for instance, the oxides such as Ta, Al, Mg, Fe, or the like, or the laminated structure of the non-magnetic metals such as Cu, Ag, Au, or the like, and the oxides such as Ta, Al, Mg, Fe, or the like, to protect the magnetic recording element. The cap layer 15, when the low current density of the switching current is realized, may be composed of the non-magnetic metals such as Ru, Cu, Ag, Au, Ta, or the like.

As to the magnetic recording element with such structure, like the first experiment example, samples are prepared to evaluate the characteristic thereof.

Specifically, the materials of the magnetic free layers in the samples AA1 to AA8 of the first experiment example are replaced to the materials formed from MgO or the non-magnetic body matrix composed of $Al_2O_{3-x}$, $SiO_{2-x}$, TiOx, ZnOx, and the fine particles composed of AA1 to AA8 magnetic free layer materials. The formation of the magnetic free layer is possible by performing simultaneous vapor deposition of, for instance, the non-magnetic material and the magnetic fine particle material. Further, it is possible by embedding periphery with the non-magnetic material while miniaturized-processing the magnetic film to a pattern.

In this case, the thickness of the magnetic free layer, in some cases, becomes somewhat thicker than the samples AA1 to AA8 of the first experiment example, and the maximum is 10 nm. However, in this structure, since a current concentration effect is generated, it was confirmed that the magnetization reversal is performed precisely with the small switching current density of $2\times10^6$ $A/cm^2$ or less.

(3) Third Experiment Example

Figure 16:
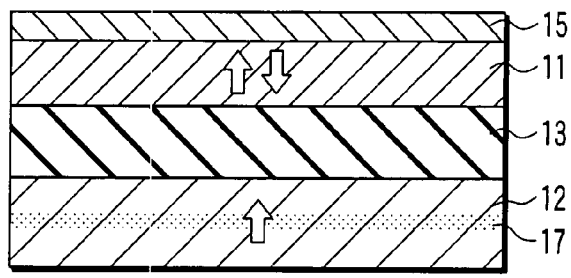
FIG. 16 is a cross-sectional view showing a structure of a magnetic recording element formed in a third experimental example.

FIG. 16 shows a structure of a magnetic recording element formed experimentally in a third experiment example.

The magnetic recording element is composed of a laminated structure of a magnetic free layer 11, a magnetic pinned layer 12 and a non-magnetic barrier layer 13 therebetween. The characteristic of the magnetic recording element is that a layer 17 including oxygen is formed inside the magnetic pinned layer 12. The layer 17 including oxygen has a function for stabilizing magnetization state of the magnetic pinned layer 12.

The cap layer 15 with thickness of 10 nm or less is arranged on the magnetic free layer 11.

The cap layer 15 can be composed of, for instance, the oxides such as Ta, Al, Mg, Fe, or the like, or the laminated structure of the non-magnetic metals such as Cu, Ag, Au, or the like, and the oxides such as Ta, Al, Mg, Fe, or the like, to protect the magnetic recording element.

It is more preferable for the cap layer 15 to be composed of one selected from the group consisting of oxide, nitride and fluoride with thickness of 1 nm or less.

The cap layer 15, when the low current density of the switching is realized, may be composed of the non-magnetic metals such as Ru, Cu, Ag, Au, Ta, or the like.

As to the magnetic recording element with such structure, like the first experiment example, when evaluating the characteristic while preparing a plurality of samples, it was confirmed that the magnetization reversal is performed precisely with the small switching current density of $2 \times 10^6$ A/cm$^2$ or less.

(4) Fourth Experiment Example

Figure 17:
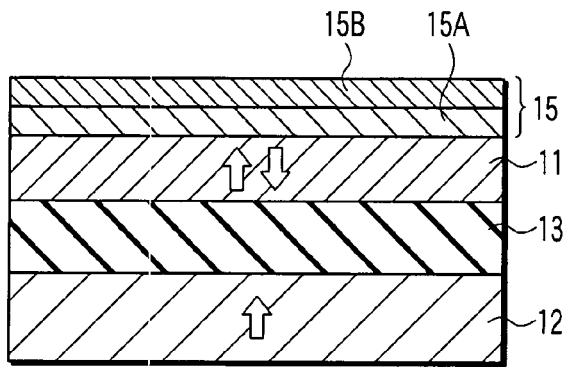
FIG. 17 is a cross-sectional view showing a structure of a magnetic recording element formed in a fourth experimental example.

FIG. 17 shows a structure of a magnetic recording element formed experimentally in fourth experiment example.

The magnetic recording element is composed of a laminated structure of a magnetic free layer 11, a magnetic pinned layer 12 and a non-magnetic barrier layer 13 therebetween. The characteristic of the magnetic recording element is that the cap layer 15 covering an upper surface of the magnetic free layer 11 has a two-layer structure.

A cap layer 15A is composed of the non-magnetic metal with thickness of 3 nm or less. A cap layer 15B is composed of one selected from the group consisting of oxide, nitride and fluoride with thickness of 1 nm or less.

As to the magnetic recording element with such structure, like the first experiment example, when evaluating the characteristic while preparing a plurality of samples, it was confirmed that the magnetization reversal is performed precisely with the small critical switching current density of $2 \times 10^6$ A/cm$^2$ or less.

(5) Fifth Experiment Example

Figure 18:
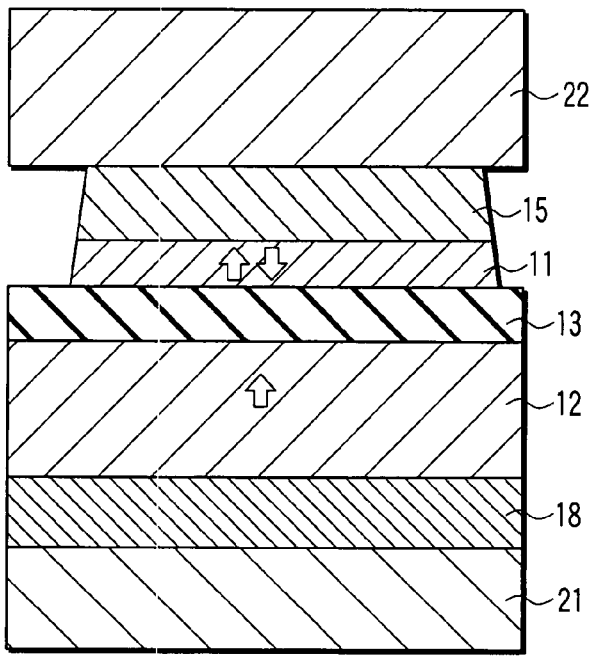
FIG. 18 is a cross-sectional view showing the structure of the magnetic recording element formed in the fifth experimental example.
Figure 19:
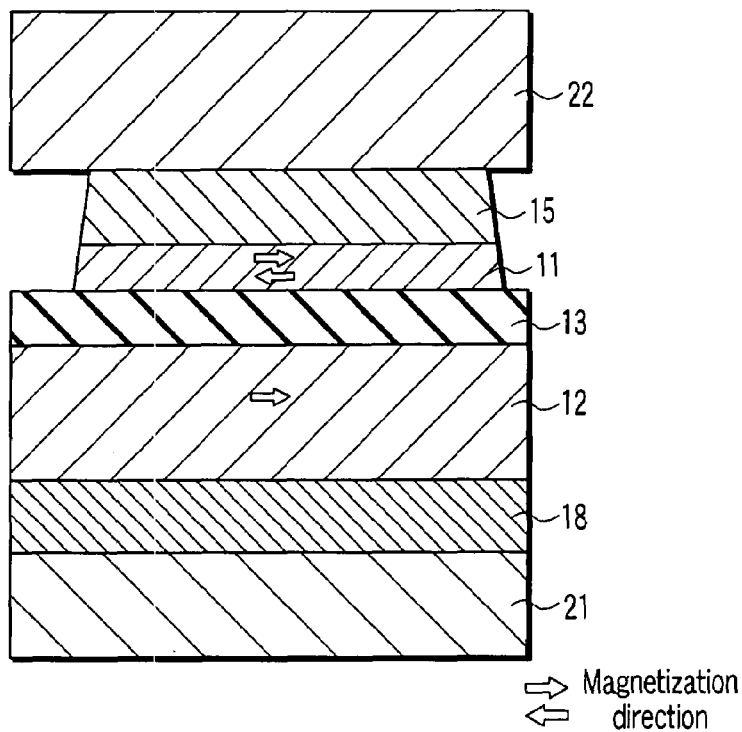
FIG. 19 is a cross-sectional view showing the structure of the magnetic recording element formed in the fifth experimental example.

FIGS. 18 and 19 each shows a structure of a magnetic recording element of a fifth experiment example.

The magnetic recording element is composed of a laminated structure of a magnetic free layer 11, a magnetic pinned layer 12 and a non-magnetic barrier layer 13 therebetween, and is arranged between a lower electrode 21 and an upper electrode 22.

An anti-ferromagnetic layer 18 for fixing the magnetization of the magnetic pinned layer 12 is arranged between the magnetic pinned layer 12 and the lower electrode 21. Further, the cap layer 15 for protecting the magnetic recording element is arranged between the magnetic free layer 11 and the upper electrode 22.

In the fifth experiment example, the effects are compared between the case of adopting a perpendicular magnetization film and the case of adopting an in-plane magnetization film.

As shown in Table 2, there are five kinds of samples.

TABLE 2

| | Sample | Pined layer | Non-magnetic intermediate layer | Free layer | Ms (emu/cm$^3$) | Han (Oe) | Averaged inversion current density Jc(A/cm$^2$) | Remarks |
|---|---|---|---|---|---|---|---|---|
| Present invention | A1 | (Pt/Co)n | Al$_2$O$_3$ | Fe0.2 nm/FeCuPt1 nm | 1000 | 23000 | 8E5 | Perpendicular magnetization film |
| | A2 | GdFeCo/Fe3O4 | MgO | CoPt2 nm | 800 | 18000 | 9E5 | Perpendicular magnetization film, Cap→Cu (2 nm)/MgO |
| | A3 | FeCoPt | MgO | FeCo0.4 nm/FeCoPd1.5 nm | 900 | 21000 | 1.4E6 | Perpendicular magnetization film |
| Conventional example | B1 | CoFe/Ru/CoFe | Al$_2$O$_3$ | CoFe2.5 nm | 1440 | 100(*) | 4E7 | (*)Han of in-plane |
| | B2 | CoFe/CoFeB | MgO | CoFeB2.5 nm | 500 | 70(*) | 6E6 | (*)Han of in-plane |

In samples A1 and A3, the magnetic free layer 11 consists of double layers, in which the thinner layer is located between the non-mangetic intermediate layer and thicker layer consisting free layer.

In samples A1 to A3, as shown in FIG. 18, since the direction of easy axis of magnetization of the main magnetic free layer (thicker layer when the magnetic free layer 11 is double case) is in the perpendicular direction to the film plane, the magnetization direction of the residual magnetization of the magnetic free layer 11 is also in the perpendicular direction to the film plane, that is, in the lamination direction of the magnetic free layer 11, the magnetic pinned layer 12 and the non-magnetic barrier layer 13. Further, the magnetization of the magnetic pinned layer 12 is fixed in the perpendicular direction to the film plane by the anti-ferromagnetic layer 18.

In samples B1, B2, as shown in FIG. 19, since the direction of easy axis of magnetization of the magnetic free layer 11 is parallel to the film plane, the magnetization direction of the residual magnetization of the magnetic free layer 11 is also parallel to the film plane, that is, it is in the in-plane direction of the magnetic free layer 11. Further, the magnetization of the magnetic pinned layer 12 is fixed in the in-plane direction to the film plane by the anti-ferromagnetic layer 18.

Figure 20:
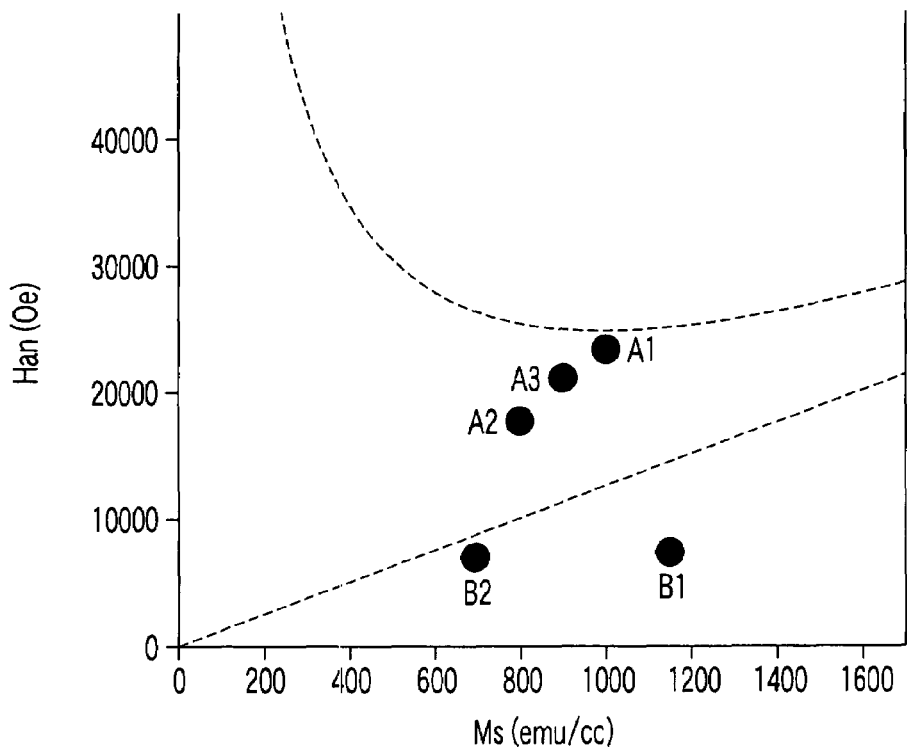
FIG. 20 is a view showing a range of the magnetic recording element formed in the fifth experimental example.

The samples A1 to A3 are the magnetic recording elements according to the example of the present invention, as shown in FIG. 20, which are within the range of the conditions represented in the first embodiment.

In the sample A1, the magnetic free layer 11 is composed of laminated structure of Fe(0.2 nm)/FeCuPt(1 nm), the magnetic pinned layer 12 is composed of laminated structure of Pt/Co, and the non-magnetic barrier layer 13 is composed of $Al_2O_{3-x}$. Numeral values in parentheses show thickness.

In the sample A2, the magnetic free layer 11 is composed of CoPt(2 nm), the magnetic pinned layer 12 is composed of the laminated structure of $GdFeCo/Fe_3O_4$, and the non-magnetic barrier layer 13 is composed of MgO. Numeral values in parentheses show thickness.

In the sample A3, the magnetic free layer 11 is composed of laminated structure of FeCo(0.4 nm)/FeCoPd(1.5 nm), the magnetic pinned layer 12 is composed of FeCoPt, and the non-magnetic barrier layer 13 is composed of MgO. Numeral values in parentheses show thickness.

To the contrary, the samples B1, B2 are the magnetic recording elements as comparative examples, as shown in FIG. 20, which deviate from the range of the conditions represented in the first embodiment.

In the sample B1, the magnetic free layer 11 is composed of CoFe (2.5 nm), the magnetic pinned layer 12 is composed of synthetic anti-ferromagnetic (SAF) structure of CoFe/Ru/CoFe, and the non-magnetic barrier layer 13 is composed of $Al_2O_{3-x}$. Numeral values in parentheses show thickness.

In the sample B2, the magnetic free layer 11 is composed of CoFeB (2.5 nm), the magnetic pinned layer 12 is composed of the laminated structure of CoFe/CoFeB, and the non-magnetic barrier layer 13 is composed of MgO. Numeral values in parentheses show thickness.

To these samples A1, A2, A3, B1, and B2, the current is caused to flow in the lamination direction of the magnetic recording element to monitor necessary switching current density for reversing the magnetization of the magnetic free layer.

As a result, in the sample A1, the switching current density Jc became $8\times10^5$ $A/cm^2$, the switching current density Jc being obtained in such a way that an absolute value of the switching current density when inverting from anti-parallel to parallel and an absolute value of the switching current density when inverting from parallel to anti-parallel are averaged, and in the sample A2, the switching current density became $9\times10^5$ $A/cm^2$, and in the sample A3, the switching current density became $1.4\times10^6$ $A/cm^2$. On the contrary, in the sample B1, the switching current density became $4\times10^7$ $A/cm^2$, and in the sample B2, the switching current density became $6\times10^6$ $A/cm^2$.

As apparent from the result, according to the example of the present invention, it is possible to minimize the current density of the spin injection current to a value of ⅕ or less than the conventional one, so it has been confirmed that the switching current density of $2\times10^6$ $A/cm^2$ or less can be realized.

(6) Others

The effect in accordance with the example of the present invention does not change depending on the shape and dimension of the magnetic recording element, the shape, dimension, and material of the lower/upper electrodes, and further, the kind of insulating layer such as passivation layer or the like. Therefore, it is possible to adopt them by those skilled in the art while selecting from a known range appropriately.

As to the magnetic free layer, the magnetic pinned layer and the non-magnetic barrier layer constituting the magnetic recording element, it is not necessary for them to be the same shape, or the same size, and thus it is possible to design them so as to be different shape or different size with each other.

However, on the manufacturing process, it is preferable for the flat surface shape of the magnetic free layer to be square, rectangle, polygon (for example, hexagon) circular form, oval, diamond, or parallelogram, with aspect ratio within the range of 1:1 to 1:4.

Further, it is preferable for the size of the magnetic free layer to be within 5 nm to 200 nm in one side.

It is preferable in terms of manufacturing process for a cross-sectional shape, such as tetragon, trapezoid of the magnetic recording element that the size of cross section of the magnetic free layer, the magnetic pinned layer and the non-magnetic barrier layer are the same, or are made to change continuously. However, it may be preferable for the size of the cross section of each layer to be changed discontinuously.

Further, it is preferable for the constituent such as the anti-ferromagnetic layer, the magnetic pinned layer, the non-magnetic barrier layer, the magnetic free layer, the cap layer, the insulating layer, and the like, each, to he single layer, or to be composed of a plurality of layers.

5. Application Example

There will be described the application example of the magnetic recording element according to the example of the present invention.

Here, described are examples of a magnetic random access memory (MRAM) as a magnetic memory, a probe memory, and a spin field effect transistor (FET) for realizing a re-configurable logic circuit.

(1) Magnetic Fandom Access Memory

When applying the magnetic recording element according to the example of the present invention to the magnetic random access memory, there is no limitation about kind or structure of the memory cell array. Hereinafter, 1 transistor-1 magneto tunnel junction (MTJ) suitable for current-driven writing is taken as a representative example.

A. Circuit Structure

FIG. 21 shows a circuit structure of the memory cell array of the magnetic random access memory according to the example of the present invention.

A memory cell array 31 is composed of a plurality of memory cells MC1, MC2, MC3, and MC4 arranged in an array shape. The memory cells MC1, MC2, MC3, and MC4 each are composed of a magnetic recording element MTJ and a MOS transistor TR connected in series.

A gate of the MOS transistor TR is connected to word lines WL(i), WL (i+1). The word lines WL(i), WL(i+1) extend in an x-direction, and one end thereof is connected to a word line driver 32 via a MOS transistor RSW as a row selection switch.

Row selection signals RSL(i), RSL(i+1) for selecting one row of the memory cell array 31 are input to a gate of the MOS transistor RSW at the time of read/write.

The word line driver 32 drives the word line inside the selected one row. For instance, when the word line WL(i) is selected, the potential of the word line WL(i) is made high, and the MOS transistor TR connected to the word line WL(i) is turned on.

One end of the magnetic recording element MTJ constituting the memory cells MC1, MC2, MC3, and MC4 is connected to bit lines BLu(j), BLu(j+1).

The bit lines BLu(j), BLu(j+1) extend in a y-direction crossing the x-direction, and one end thereof is connected to a bit line driver/sinker 33 via a MOS transistor CSWu as a column selection switch.

Column selection signals CSLu(j), CSLu(j+1) for selecting one column of the memory cell array 31 are input to the gate of the MOS transistor CSWu at the time of read/write.

One end of the MOS transistor TR constituting the memory cells MC1, MC2, MC3, and MC4 is connected to bit lines BLd(j), BLd(j+1).

The bit lines BLd(j), BLd(j+1) extend in the y-direction and one end thereof is connected to a bit line driver/sinker 34 via a MOS transistor CSWd as a column selection switch.

Column selection signals CSLd(j), CSLd(j+1) for selecting one column of the memory cell array 31 are input to the gate of the MOS transistor CSWd at the time of write.

Further, one end of the bit lines BLd(j), BLd(j+1) is connected to a common read line RL via a MOS transistor CSWr as the column selection switch, and the common read line RL is connected to a sense amplifier S/A.

Column selection signals CSLr(j), CSLr(j+1) for selecting one column of the memory cell array 31 are input to the gate of the MOS transistor CSWr at the time of read.

The sense amplifier S/A judges a data value of the magnetic recording element NTJ inside the selected memory cell MC based on a reference potential Vref, and outputs tha value as an output signal DATA.

Here, the bit line driver/sinkers 33, 34 are provided so as to pass the switching current Is to the bit line inside the selected one column.

There is assigned "1" to the magnetization state of the magnetic recording element MTJ which is in anti-parallel, and "0" to the magnetization state of the magnetic recording element MTJ which is in parallel.

When writing "1" to the memory cell MC1, the row selection signal RSL(i) is made high, the word line WL(i) is made high, and the MOS transistor TR inside the memory cell MC1 is turned on.

Further, the switching current Is toward the bit line driver/sinker 34 is caused to flow via the memory cell MC1 from the bit line driver/sinker 33 while making the column selection signals CSLu(j), CSLd(j) high. At this time, in the magnetic recording element MTJ inside the memory cell MC1, the magnetization state becomes an anti-parallel because of the spin-polarized electrons, so that "1" is written.

Further, when writing "0" in the memory cell MC1, similarly, the row selection signal RSL(i) is made high, the word line WL(i) is made high, and the MOS transistor TR inside the memory cell MC1 is turned on.

Further, the switching current Is toward the bit line driver/sinker 33 is caused to flow via the memory cell MC1 from the bit line driver/sinker 34 while making the column selection signals CSLu(j), CSLd(j) high. At this time, in the magnetic recording element MTJ inside the memory cell MC1, the magnetization state becomes parallel because of the spin-polarized electrons, so that "0" is written.

As for the read, for instance, it is executed using the sense amplifier S/A and the bit line driver/sinker 33.

For instance, when reading the data of the memory cell MC1, the row selection signal RSL(i) is made high, the word line WL(i) is made high, and the MOS transistor TR inside the memory cell MC1 is turned on.

Further, the column selection signal CSLu(j) is made high, the bit line BLu(j) is electrically connected to the bit line driver/sinker 33, the column selection signal CSLr(j) is made high, and the bit line BLd(j) is electrically connected to the sense amplifier S/A.

The bit line driver/sinker 33 connects, for instance, one end of the bit line BLu(j) to the grounding point, and the sense amplifier S/A supplies the read current tc the memory cell MC1. The sense amplifier S/A detects a resistance value when the read current flows in the magnetic recording element MTJ inside the memory cell MC1 to judge the data value stored therein.

B. Device Structure

FIGS. 22 to 25 show an example of a device structure of the memory cells MC1, MC2, MC3 and MC4 of FIG. 21.

The memory cell is composed of the MOS transistor TR and the magnetic recording element (magnetoresistive element) MTJ according to the example of the present invention.

The MOS transistor TR is prepared on a semiconductor substrate 41. The gate electrode of the MOS transistor TR extends in the x-direction (in the direction orthogonal to the page space) as the word line WL(i).

One of two source/drain diffusion layers of the MOS transistor TR is connected to a lower bit line BLd(j), while the other is connected to one end (lower surface) of the magnetic recording element MTJ. The other end (upper surface) of the magnetic recording element MTJ is connected to the upper bit line BLu(j).

The upper but line BLu(j) and the lower bit line BLd(j) each extend in the y-direction.

The magnetic recording element has a top pin structure. That is, an under layer 43, the magnetic free layer 11, a tunnel barrier layer (insulating layer) 13, the magnetic pinned layer 12, an anti-ferromagnetic layer 18, and the cap layers 15A, 15B are laminated from the semiconductor substrate 41 side in this order.

Note that the magnetic recording element may have a bottom pin structure.

In the memory cell of such a device structure, as shown in FIG. 22, in "1"-programming, from a current source inside the bit line driver/sinker 33 of FIG. 21, the switching current Is is caused to flow toward the grounding point via the route of the upper bit line BLu(j)→the magnetic recording element MTJ→the lower bit line BLd(j).

At this time, in the inside of the magnetic recording element MTJ, electrons flow toward the magnetic pinned layer 12 from the magnetic free layer 11. In general, when the electrons flow toward the magnetic pinned layer 12 from the magnetic free layer 11, the magnetization of the magnetic free layer 11 becomes anti-parallel to the magnetization of the magnetic pinned layer 12.

Further, as shown in FIG. 23, in the "0"-programming, from a current source inside the bit line driver/sinker 34 of FIG. 21, the switching current Is is caused to flow toward the grounding point via the route of the lower bit line BLd(j)→the magnetic recording element MTJ→the upper bit line BLu(j).

At this time, in the inside of the magnetic recording element MTJ, electrons flow toward the magnetic free layer 11 from the magnetic pinned layer 12. In general, when the electrons flow toward the magnetic free layer 11 from the magnetic pinned layer 12, the magnetization of the magnetic free layer 11 becomes parallel to the magnetization of the magnetic pinned layer 12.

Figure 24:
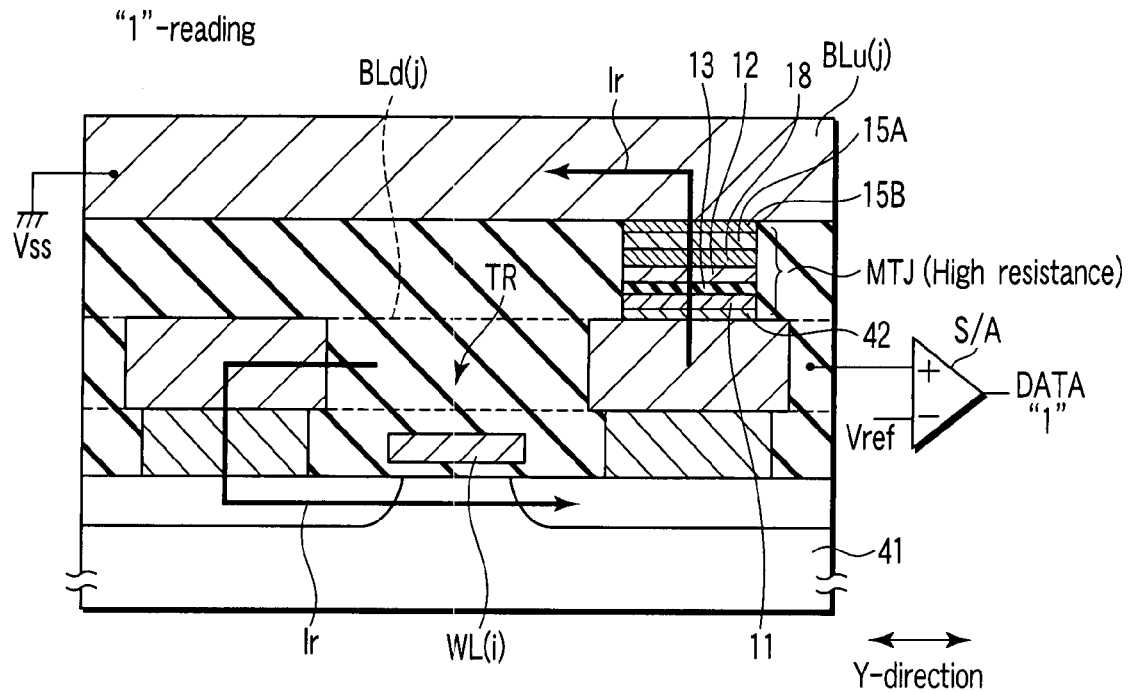
FIG. 24 is a cross-sectional view showing the state of the memory cell in "1"-reading.
Figure 25:
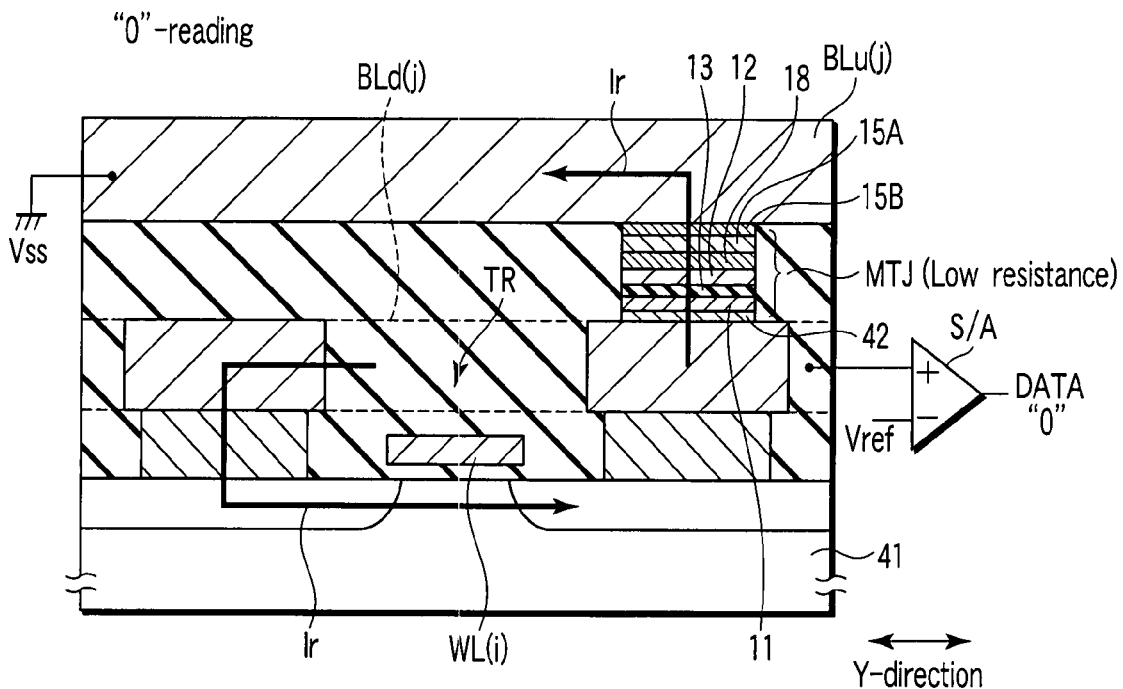
FIG. 25 is a cross-sectional view showing the state of the memory cell in "0"-reading.

At the time of reading, as shown in FIGS. 24 and 25, for instance, a read current Ir is caused to flow toward the grounding point via the magnetic recording element MTJ from the sense amplifier S/A. When the read current Ir flows to the magnetic recording element MTJ, an input potential of the sense amplifier S/A varies in accordance with a state of the magnetic recording element MTJ.

For instance, as shown in FIG. 24, when "1"-data is stored in the magnetic recording element MTJ, the resistance value of the magnetic recording element MTJ becomes large (anti-parallel state), and the input potential of the sense amplifier S/A becomes higher than the reference potential Vref.

Therefore, the sense amplifier S/A outputs "1" as the output signal DATA.

Further, as shown in FIG. 25, when "0"-data is stored in the magnetic recording element MTJ, the resistance value of the magnetic recording element MTJ becomes small (parallel state), and the input potential of the sense amplifier S/A becomes lower than the reference potential Vref.

Therefore, the sense amplifier S/A outputs "0" as the output signal DATA.

Incidentally, in the present example, the direction of the read current Ir is the direction toward the upper bit line BLu(j) from the lower bit line BLd(j). However, the direction of the read current Ir may be at opposite direction, that is, the direction toward the lower bit line BLd(j) from the upper bit line BLu(j). Further, a different method from the present example may be adopted as the reading method.

The value of the read current Ir is minimized sufficiently than the value of the switching current Is in order to suppress disturb at the time of reading. Specifically, it is preferable for the value of the read current Ir to be smaller than the critical current Ic of the magnetization reversal.

In the present example, there is assigned "1" to the magnetization state of the magnetic recording element MTJ which is in anti-parallel, and "0" to the magnetization state of the magnetic recording element MTJ which is in parallel, or vice versa.

As for the reading, it is preferable that, in order to obtain high signal output by increasing the MR (magneto-resistive) ratio, the tunnel barrier layer is composed of high resistive material, for instance, insulating material such as alumina, MgO or the like.

Further, instead of such tunnel barrier layer, if the CPP—CPP-MR material in which Cu, magnetic body or the like is embedded in many holes provided in the insulating material, or the nano contact MR material is adopted as the non-magnetic barrier layer between the magnetic free layer and the magnetic pinned layer, it is more preferable for the reading.

There is no problem even though the elements such as bipolar transistor, diode or the like are utilized instead of the MOS transistor TR, as long as they have a function as the selection switch.

C. Layout of Magnetic Recording Element

As for the layout of the magnetic recording element MTJ, it is possible to suppose various types including association with structure of the memory cell array.

The memory cell array shown in FIGS. 22 to 25 is 1 transistor-1 MTJ type in which the memory cell is composed of one transistor and one magnetic recording element. In this case, independent one magnetic recording element MTJ is allocated to one memory cell.

Figure 26:
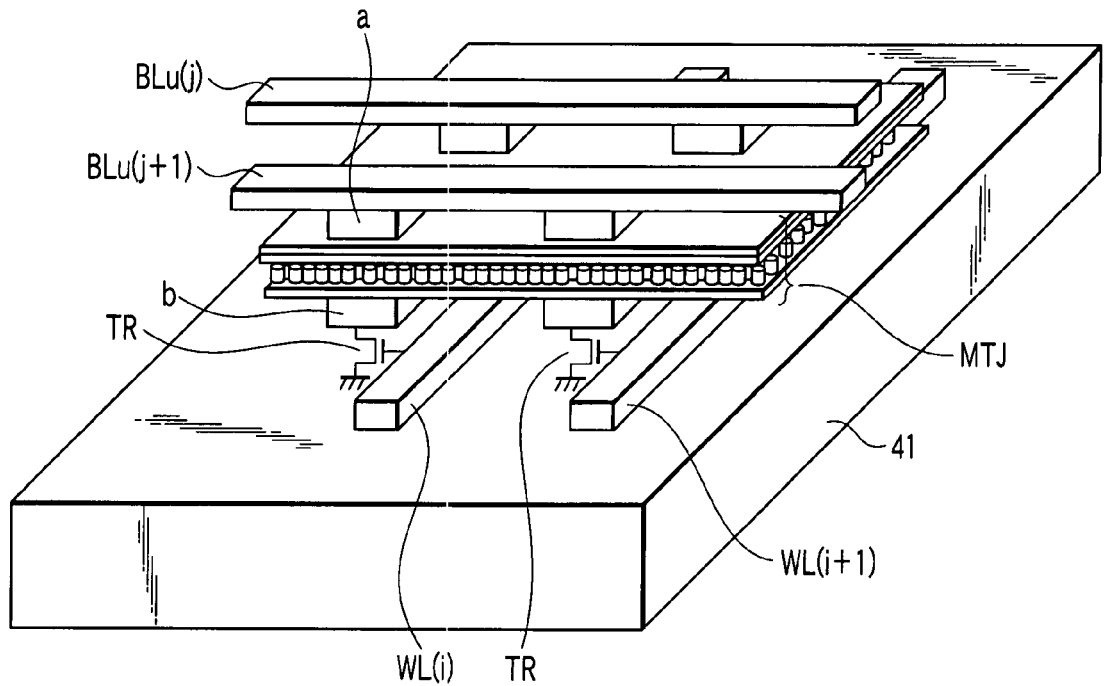
FIG. 26 is a view showing an example of a layout of the magnetic recording element.

On the contrary, as shown in FIG. 26, in the memory cell array of the 1 transistor-1 MTJ type, the magnetic recording element MTJ of all the memory cells may be integrated by constituting the magnetic recording element MTJ with aggregates of a plurality of magnetic particles (polycrystalline structure) separated by the non-magnetic material.

In this case, the magnetic recording element MTJ is formed thickly all over the semiconductor substrate 41, and thus the manufacturing process is simplified, thereby realizing decrease of the manufacturing cost.

Even in such a structure, the magnetic recording element MTJ is composed of the aggregates of the plurality of magnetic particles, and thus the magnetization direction is determined for each magnetic particle. Therefore, it is possible to selectively change only the magnetization of region between plugs a, b.

Therefore, the function as the magnetic memory is completely the same as the magnetic memory of the structure of FIGS. 22 to 25.

Figure 27:
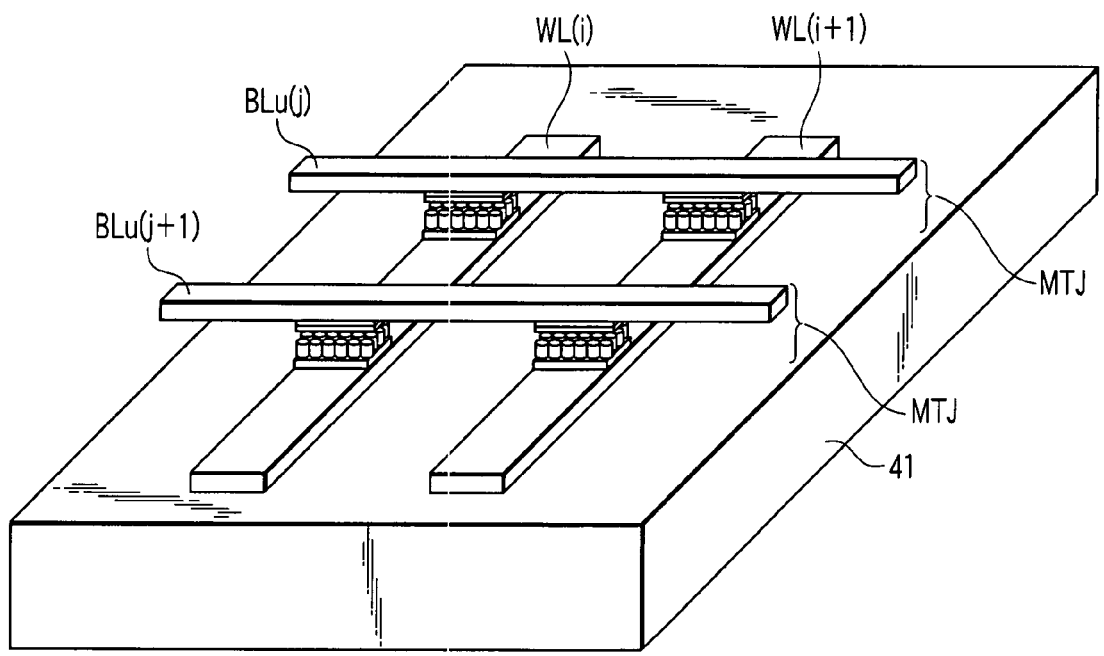
FIG. 27 is a view showing an example of a layout of the magnetic recording element.

The memory cell array shown in FIGS. 27 to 29 is a cross point type memory cell array.

In the structure in FIG. 27, like the structure in FIGS. 22 to 25, one independent magnetic recording element MTJ is allocated to one memory cell.

Further, in the structure in FIG. 28, the layout of the magnetic recording element MTJ is performed along the bit lines BL(j), BL(j+1) directly under the bit lines BL(j), BL(j+1). In this case, since the magnetic recording element MTJ is processed at the same time of process of the bit lines BL(j), BL(j+1), the manufacturing process is simplified, and it is possible to realize decrease of the manufacturing cost.

In the structure in FIG. 29, the magnetic recording element MTJ is formed thickly all over the region between the word lines WL(i), WL(i+1) and the bit lines BL(j), BL(j+1). In this case, since the process of the magnetic recording element MTJ may be omitted, the manufacturing process is simplified, and it is possible to reduce the manufacturing cost.

Even in the structure in FIGS. 28 and 29, the magnetic recording element MTJ is composed of the aggregates of the plurality of magnetic particles, and thus the magnetization direction is determined for each magnetic particle. Therefore, it is possible to selectively change only the magnetization of a crossing part between the word lines WL(i), WL(i+1) and the bit lines BL(j), BL(j+1).

Therefore, the function as the magnetic memory is identical in the whole cross point type magnetic memory in FIGS. 27 to 29.

(2) Probe Memory

The probe memory is a next generation memory having possibility that the recording density can be improved rapidly in comparison with the present memory.

The probe memory has, for instance, a cantilever shaped probe at upper part of the recording medium, and an access operation is performed by controlling a positional relationship between the recording medium and the probe. In particular, if using MEMS (micro electro mechanical systems) technique, it is possible to mixed-mount the recording medium and the probe on the semiconductor chip. Actually, specific ones such as a millipede, or the like are proposed.

If the magnetic recording element in the example of the present invention is utilized as the recording medium of such probe memory, it is possible to contribute to the practical application of the probe memory.

A. Basic Structure

Figure 30:
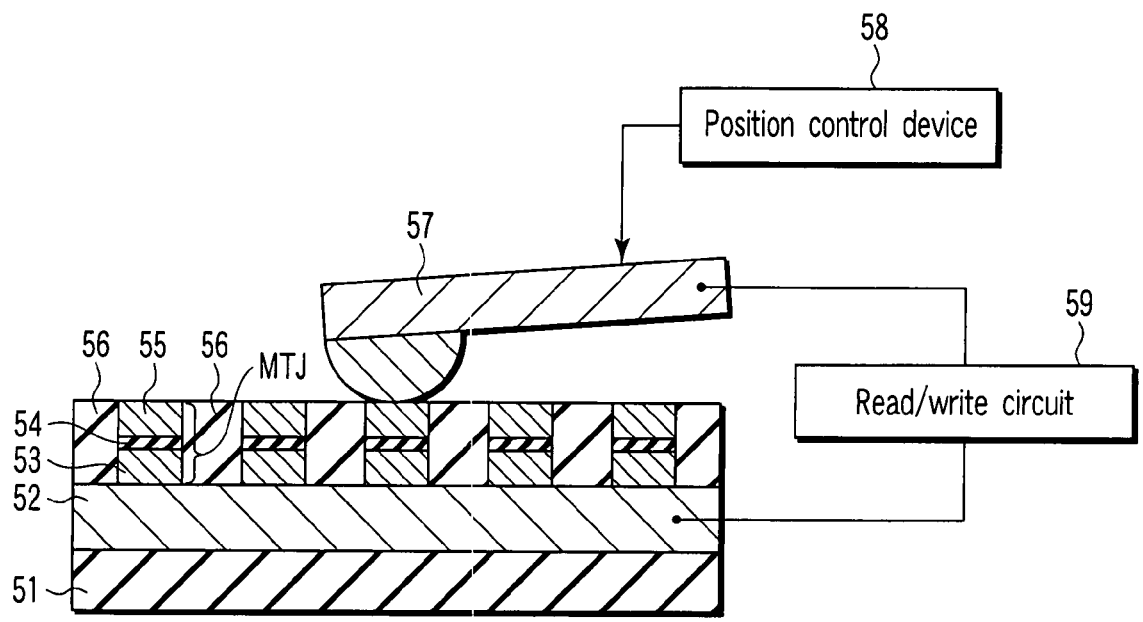
FIG. 30 is a view showing a basic structure of a probe memory as an application example.

FIG. 30 shows a basic structure of the probe memory.

On an insulating substrate 51, a conductive layer 52 is formed, and on the conductive layer 52, a plurality of magnetic recording elements MTJ according to the example of the present invention is arranged in an array shape. The respective magnetic recording elements MTJ have, for instance, a laminated structure of a magnetic pinned layer 53, a non-magnetic barrier layer (for instance, tunnel barrier layer) 54 and a magnetic free layer 55. Spaces among the plurality of magnetic recording elements MTJ are filled with an insulating layer 56.

Such an array of the magnetic recording element MTJ is called as "patterned medium".

On the patterned medium, for instance, a cantilever shaped probe 57 is arranged. The shape of the probe 57 is not particularly limited, and it may be needle-shape. However, in the case of adopting the cantilever shape, for instance, it is possible to make up advantageously the probe on the semiconductor chip by the MEMS technique.

The position of the probe 57 is controlled by a position control device 58. For instance, the position control device 58 drives the prove 57 with 2-dimention (x, y) or 3-dimension (x, y, z) to perform access operation thereby. The probe 57 may always come into contact with an upper surface of the patterned medium, or may always be separated therefrom with a constant distance.

A read/write circuit 59, at the time of reading, reads the data stored in the magnetic recording element MTJ by causing the read current to flow through the magnetic recording element MTJ. Further, the read/write circuit 59, at the time of writing, controls the magnetization state of the magnetic recording element MTJ by causing the switching current with the direction according to the write data to flow through the magnetic recording element MTJ.

In such a probe memory, at the time of "1"-writing, the position control device 58 determines relative position between the patterned medium and the probe 57 based on the address signal, and the read/write circuit 59 causes the switching current Is to flow in the direction toward the probe 57 from the conductive layer 52.

At this time, in the inside of the magnetic recording element MTJ, since the electrons flow toward the magnetic pinned layer 53 from the magnetic free layer 55, the magnetization of the magnetic free layer 55 becomes ant-parallel to the magnetization of the magnetic pinned layer 53.

Further, at the time of "0"-writing, the position control device 58 determines relative position between the patterned medium and the probe 57 based on the address signal, and the read/write circuit 59 causes the switching current Is to flow in the direction toward the conductive layer 52 from the probe 57.

At this time, in the inside of the magnetic recording element MTJ, since the electrons flow toward the magnetic free layer 55 from the magnetic pinned layer 53, the magnetization of the magnetic free layer 55 becomes parallel to the magnetization of the magnetic pinned layer 53.

At the time of reading, the position control device 58 determines the relative position between the patterned medium and the probe 57 based on the address signal, and the read/write circuit 59 supplies the read current Ir to the magnetic recording element MTJ.

The direction of the read current Ir is not limited, while the value of the read current Ir is made sufficiently smaller than the value of the switching current Is in order to suppress disturb at the time of reading. Specifically, the value of the read current Ir is made smaller than the critical current Ic of the magnetization reversal.

Incidentally, in the present example, there is assigned "1" to the magnetization state of the magnetic recording element MTJ which is in anti-parallel, and "0" to the magnetization state of the magnetic recording element MTJ which is in parallel, or vice versa.

As for the reading, it is preferable that, in order to obtain high signal output by increasing the MR ratio, the non-magnetic barrier layer 54 is used as the tunnel barrier layer (for instance, insulating material such as alumina, MgO or the like).

Further, instead of such tunnel barrier layer, if the CPP—CPP-MR material in which Cu, magnetic body or the like is embedded in many holes provided in the insulating material, or the nano contact MR material is used as the non-magnetic barrier layer between the magnetic free layer and the magnetic pinned layer, it is more preferable for the reading.

Here, in the example in FIG. 27, a system is that the position of the probe 57 is controlled by the position control device 58 while fixing the position of the patterned medium. However, if the control of relative position between the patterned medium and the probe 57 is possible, it is no problem that either the probe or the insulating substrate 51 may be driven.

Figure 31:
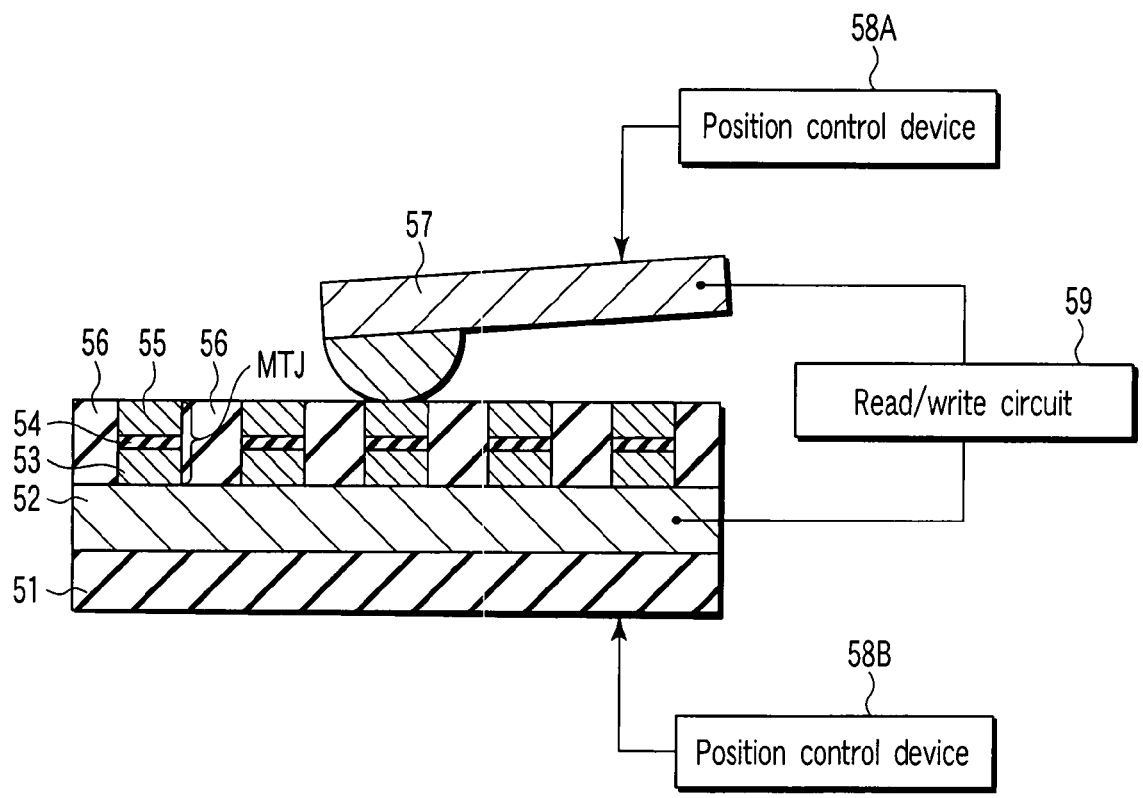
FIG. 31 is a view showing a modified example of the probe memory of FIG. 30.

For instance, as shown in FIG. 31, it is also possible to control the relative position between the patterned medium and the probe by the position control devices 58A, 58B.

Further, as a hard disk drive, an access operation may be performed by driving the probe 57 linearly while rotating the insulating substrate 51.

FIGS. 32 and 33 show the modified example of the probe memory in FIG. 30.

The probe memory in FIG. 32 is characterized in that the magnetic pinned layer 53 and the non-magnetic barrier layer 54 are shared with the whole magnetic recording elements MTJ. In this case, the magnetic pinned layer 53 and the non-magnetic barrier layer 54 are formed thickly all over the conductive layer 52, and since it is preferable to perform patterning on only the magnetic free layer 55, it is possible to realize simplification of the manufacturing process and improvement of element characteristic.

The probe memory in FIG. 33 has characteristic in that an upper surface of the patterned medium is covered with a protective layer 60. The protective layer 60 is composed of, for instance, an extremely thin insulating body. In this case, since the probe 57 does not come into directly contact with the magnetic recording element MTJ, it is possible to improve reliability of the magnetic recording element MTJ and the number of times of the read/write.

Further, instead of the protective layer 60, the probe 57 may be separated from the magnetic recording element MTJ with a constant distance, and a space may be provided between the probe 57 and the magnetic recording element MTJ. Further, there may be provided the protective layer 60, and the probe 57 may be separated from the protective layer 60 with a constant distance.

B. Multi probe structure

There will be described an example of the probe memory with a multi probe structure suitable for realization of high recording density.

FIG. 34 shows a circuit structure of the probe memory according to an example of the present invention.

Blocks BK11, . . . BKij are arranged in matrix shape. It is preferable for the respective blocks BK11, . . . BKij to be separated physically, or it is preferable for the respective blocks BK11, . . . BKij to be integrated. The respective blocks BK11, . . . BKij, for instance, as shown in FIG. 29, are constituted by the patterned medium composed of the plurality of magnetic recording elements.

When the blocks BK11, . . . BKij are totally arranged with the matrix shape of 32×32, and each of the blocks BK11, . . . BKij is composed of magnetic recording elements of 32×32, storage capacity of one block becomes 1 kilo-bit, and storage capacity of the probe memory becomes 1 mega-bit.

The probe 57, like the blocks BK11, . . . BKij, is arranged in the matrix shape, and the probe 57 corresponds to the block BKij one to one.

The probe 57 is connected to the bit lines BLu(1), . . . BLu(j) via the MOS transistor TR.

The gate of the MOS transistor TR is connected to the word lines WL(1), . . . WL(i). The word lines WL(1), . . . WL(i) extend in the x-direction, and its one end is connected to the word line driver 32 via the MOS transistor RSW as the row selection switch.

To the gate of the MOS transistor RSW, at the time of the read/write, the row selection signals RSL(1), . . . RSL(i) for selecting one of the blocks BK11, . . . BKij are input.

The word line driver 32 drives the word line inside the selected one row. For instance, when the word line WL(1) is selected, the potential of the word line WL(1) is made high, and the MOS transistor TR connected to the word line WL(1) is turned on.

The bit lines BLu(1), ... BLu(j) extend in the y-direction, and its one end is connected to the bit line driver/sinker 33 via the MOS transistor CSWu as a column selection switch.

The column selection signals CSLu(1), ... CSLu(j) for selecting one of the blocks BK11, ... BKij are input to the gate of the MOS transistor CSWu at the time of read/write.

One end (corresponding to the conductive layer 52 in FIG. 25) of the blocks BK11, ... BKij is connected to the bit lines BLd(1), ... BLd(j).

The bit lines BLd(1), ... BLd(j) extend in the y-direction, and its one end is connected to the bit line driver/sinker 34 via the MOS transistor CSWd as a column section switch.

The column selection signals CSLd(1), ... CSLd(j) for selecting one of the blocks BK11, ... BKij are input to the gate of the MOS transistor CSWd at the time of writing.

Further, one end of the bit lines BLd(1), ... BLd(j) is connected to a common read line RL via the MOS transistor CSWr as the column selection switch, and the common read line RL is connected to the sense amplifier S/A.

The column selection signals CSLr(1), ... CSLr(j) for selecting one of the blocks BK11, ... BKij are input to the gate of the MOS transistor CSWr at the time of the reading.

The sense amplifier S/A judges the data value of the selected magnetic recording element inside the selected block BLij based on the reference potential Vref to output it as the output signal DATA.

Here, the bit line driver/sinkers 33, 34 are provided to cause the switching current Is to flow through the selected magnetic recording element inside the selected one block BKij.

Binary "1" is assigned to the magnetization state of the magnetic recording element which is in anti-parallel, and binary "0" to the magnetization state of the magnetic recording element which is in parallel.

When writing "1" to the magnetic recording element inside the block 11, the row selection signal RSL(1) is made high, the word line WL(1) is made high, and the MOS transistor TR corresponding to the block BK11 is turned on.

Further, the switching current Is is caused to flow toward the bit line driver/sinker 34 from the bit line driver/sinker 33 via the magnetic recording element inside the block BK11, while the column selection signals CSLu(1), CSLd(1) are made high. At this time, the magnetization state of the magnetic recording element inside the block BK11 becomes anti-parallel, so that "1" is written.

When writing "0" to the magnetic recording element inside the block BK11, the row selection signal RSL(1) is made high, the word line WL(1) is made high, and the MOS transistor TR corresponding to the block BK11 is turned on.

Further, the switching current Is is caused to flow toward the bit line driver/sinker 33 from the bit line driver/sinker 34 via the magnetic recording element inside the block BK11, while the column selection signals CSLu(1), CSLd(1) are made high. At this time, the magnetization state of the magnetic recording element inside the block BK11 becomes parallel, so that "0" is written.

The reading is executed by utilizing, for instance, the sense amplifier S/A and the bit line driver/sinker 33.

For instance, when reading the data of the magnetic recording element inside the block BK11, the row selection signal RSL(1) is made high, the word line WL(1) is made high, and the MOS transistor TR corresponding to the block BK11 is turned on.

Further, the column selection signal CSLu(1) is made high, the bit line BLu(1) is electrically connected to the bit line driver/sinker 33, the column selection signal SCLr(1) is made high, and the bit line BLd(1) is electrically connected to the sense amplifier S/A.

The bit line driver/sinker 33 connects, for instance, one end of the bit line BLu(1) to the grounding point, and the sense amplifier S/A supplies the read current to the magnetic recording element inside the block BK11. The sense amplifier S/A detects the resistance value at the time the read current flows through the magnetic recording element, and judges the data value stored therein.

Figure 35:
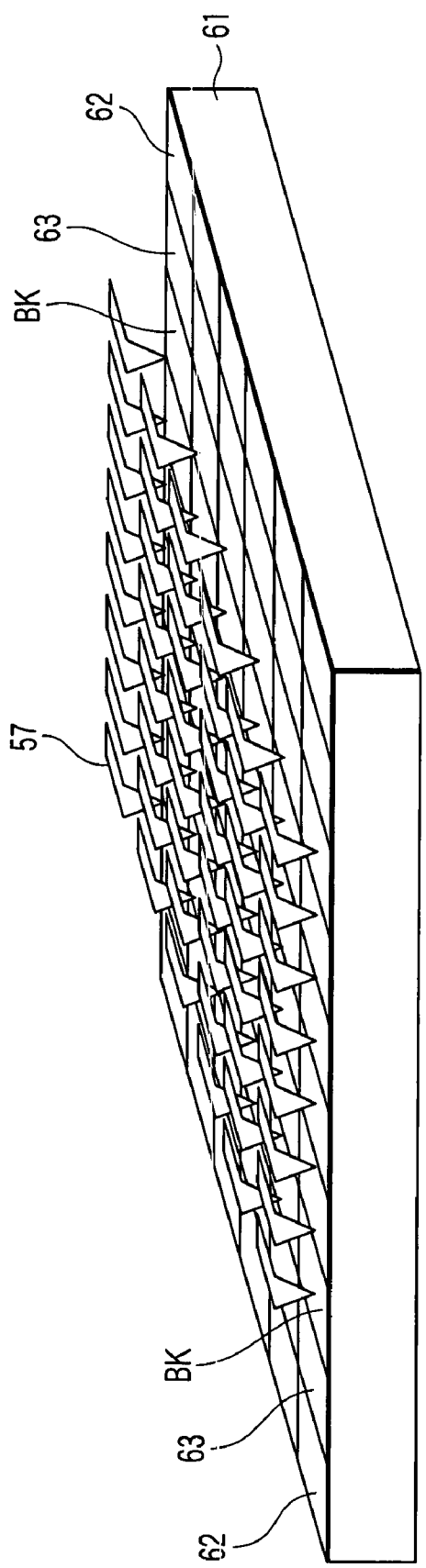
FIG. 35 is a view showing a device structure of the probe memory of FIG. 34.

FIG. 35 shows one example of a device structure of the probe memory of the multi probe structure.

In the probe memory, the patterned medium as a recording medium is formed thickly all over the center part of a semiconductor chip 61, and the patterned medium is separated into a plurality of blocks BK. On the plurality of blocks BK, a plurality of probes 57 are arranged corresponding to the plurality of blocks BK.

At a peripheral part of the semiconductor chip 61, there are provided, for instance, a servo region 62 where the position control device 58 in FIG. 30 is formed, and a peripheral circuit region 63 where the read/write circuit 59 in FIG. 30 is formed.

The characteristic of this device structure is that the whole systems shown in FIG. 30 are mounted on the semiconductor chip 61. Such semiconductor device becomes possible by utilizing the MEMS technique.

(3) Spin FET

The magnetic recording element according to an example of the present invention is applicable to the spin FET.

The spin FET itself can be utilized as the memory cell of the magnetic memory, and has been attracting attention as constituent of the re-configurable logic circuit.

Figure 36:
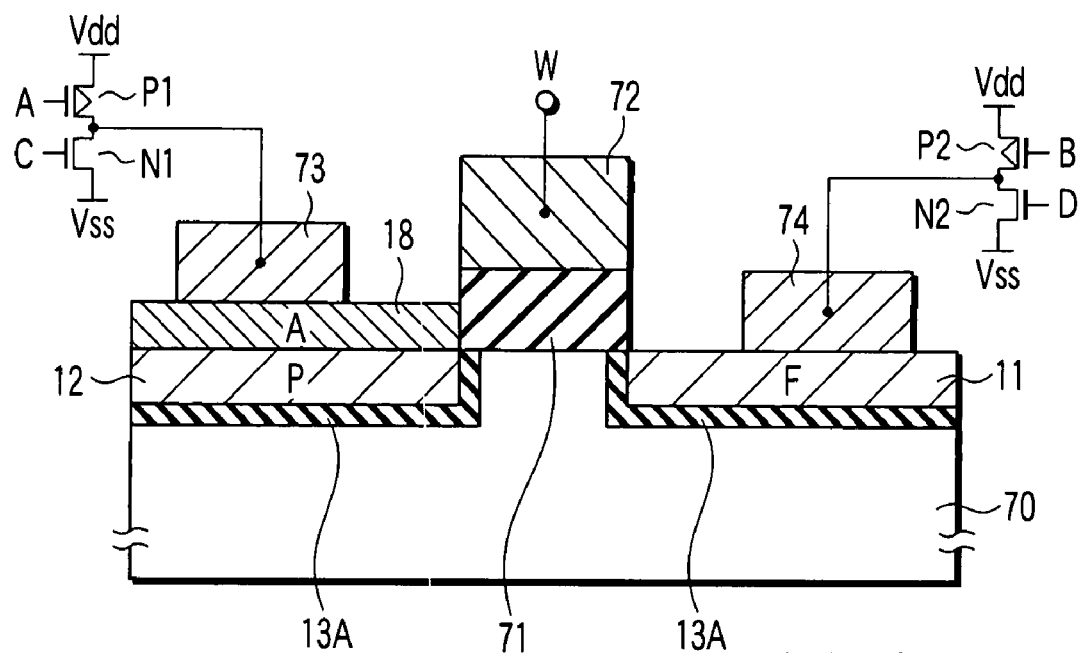
FIG. 36 is a view showing a spin FET as an application example.

FIG. 36 shows one example of the device structure of the spin FET.

The present example relates to a tunnel barrier type spin FET executing the data writing by the switching writing system.

Source/drain regions composed of the ferromagnetic layer is formed inside a semiconductor substrate 70. One of the source/drain regions is the magnetic free layer 11 in which the magnetization direction changes, and the other one is the magnetic pinned layer 12. The magnetization of the magnetic pinned layer 12 is fixed by the anti-ferromagnetic layer 18.

A non-magnetic barrier layer (tunnel barrier layer) 13A is formed between the semiconductor substrate 70 and the magnetic free layer 11, and between the semiconductor substrate 70 and the magnetic pinned layer 12. A gate electrode 72 via a gate insulating layer 71 is formed on the channel region between the magnetic free layer 11 and the magnetic pinned layer 12.

Source/drain electrodes 73, 74 are formed on the anti-ferromagnetic layer 18 and the magnetic free layer 11, respectively.

The source/drain electrode 73 is connected to the driver/sinker for generating the switching current, that is, a P-channel MOS transistor P1 and an N-channel MOS transistor N1.

Similarly, the source/drain electrode 74 is connected to the driver/sinker for generating the switching current, that is, a P-channel MOS transistor P2 and an N-channel MOS transistor N2.

In the spin FET with such a structure, the data writing is performed in such a way that a write gate voltage W is applied to the gate electrode 72, and the spin injection current is caused to flow through the magnetic free layer 11 as the source/drain region.

The value of the write data is determined by the direction of the switching current, and the direction of the switching current is controlled by turning on or off the P-channel MOS transistors P1, P2 and the N-channel MOS transistors N1, N2 by the control signals A, B, C and D.

For instance, when the magnetization state of the source/drain regions 11, 12 is made anti-parallel, the switching current is caused to flow toward the N-channel MOS transistor N2 from the P-channel MOS transistor P1. At this time, since the electrons flow toward the magnetic pinned layer 12 from the magnetic free layer 11, the magnetization direction of the magnetic free layer 11 becomes the opposite direction to the magnetization direction of the magnetic pinned layer 12.

Further, when making the magnetization state of the source/drain regions 11, 12 parallel, the switching current is caused to flow toward the N-channel MOS transistor N1 from the P-channel MOS transistor P2. At this time, since the electrons flow toward the magnetic free layer 11 from the magnetic pinned layer 12, the magnetization direction of the magnetic free layer 11 becomes the same direction as the magnetization direction of the magnetic pinned layer 12.

Although in the present example, there has been described the tunnel barrier type spin FET, the spin FET may be the Schottky barrier type having no tunnel barrier layer 13A.

(4) Others

As above, three application examples have been described, and the examples of the present invention are applicable to other spin electronics devices.

6. Conclusion

According to the example of the present invention, in the magnetization reversal technique by current direct driving, it is possible to reduce the switching current density Jc without degrading thermal fluctuation resistance and MR characteristic. Accordingly, it is possible to realize the magnetic recording element with a flat surface size (maximum width) of 20 nm or less, high reliability, low power consumption and small damages caused by heat generation, and it becomes possible to apply this to various spin electronics devices.

The example of the present invention has immeasurable effect regarding high performance of the magnetic recording element, realization of high density and low power consumption of the magnetic memory (storage device), and promotes practical application of the magnetization reversal technique using the current direct driving, and the industrial merit thereof is great.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic recording element comprising:
a magnetic free layer whose magnetization is variable in accordance with a current direction passing therethrough and whose direction of easy axis of magnetization is a direction perpendicular to a film plane;
a magnetic pinned layer whose magnetization is fixed to a direction perpendicular to the film plane; and
a non-magnetic barrier layer between the magnetic free layer and the magnetic pinned layer,
wherein the magnetic free layer has a characteristics that a relation between a saturated magnetization Ms (emu/cc) and an anisotropy field Han (Oe) satisfies $Han > 12.57 Ms$, and $Han < 1.2 E7 Ms^{-1} + 12.57 Ms$.

2. The magnetic recording element according to claim 1, wherein the saturated magnetization Ms of the magnetic free layer exceeds 600 emu/cc.

3. The magnetic recording element according to claim 1, further comprising an insertion layer provided between the magnetic free layer and the non-magnetic barrier layer, wherein the saturated magnetization Ms of the insertion layer exceeds 600 emu/cc, and thickness of the insertion layer is less than 2 nm.

4. The magnetic recording element according to claim 1, wherein the magnetic free layer is composed of fine particles separated spatially by non-magnetic materials.

5. The magnetic recording element according to claim 4, wherein the fine particles are composed of magnetic materials, and each of the fine particles constitutes a recording unit.

6. The magnetic recording element according to claim 5, wherein each of the fine particles has a magnetization direction determined independently.

7. The magnetic recording element according to claim 4, wherein one recording unit comprises plural fine particles.

8. The magnetic recording element according to claim 4, wherein the non-magnetic material includes oxygen.

9. The magnetic recording element according to claim 4, wherein there exists a layer with thickness of 3-atoms or less between the fine particles and the non-magnetic barrier layer, the layer being composed of different material from the fine particles and the non-magnetic barrier layer.

10. The magnetic recording element according to claim 1, further comprising:
a non-magnetic conductive or insulating layer which comes into contact with an opposite surface to the non-magnetic barrier layer of the magnetic free layer; and
a magnetic pinned layer which comes into contact with an opposite surface to the magnetic free layer of the non-magnetic conductive layer, and whose magnetization is fixed in a direction perpendicular to the film plane.

11. The magnetic recording element according to claim 1, further comprising a cap layer with thickness of 10 nm or less which covers an opposite surface to the non-magnetic barrier layer of the magnetic free layer.

12. The magnetic recording element according to claim 11, wherein the cap layer is composed of one selected from the group consisting of oxide, nitride and fluoride, with thickness of 1 nm or less.

13. The magnetic recording element according to claim 11, wherein the cap layer has a laminated structure of a first layer composed of one selected from the group consisting of oxide, nitride and fluoride, with thickness of 1 nm or less, and a second layer arranged between the magnetic free layer and the first layer and composed of a non-magnetic metal with thickness of 3 nm or less.

14. The magnetic recording element according to claim 1, wherein the magnetic pinned layer has a layer including oxide.

15. A magnetic memory comprising:
the magnetic recording element according to claim 1;
a current source which generates a switching current having current density for reversing a magnetization direction of a magnetic free layer of the magnetic recording element; and
a current path which leads the switching current to the magnetic recording element.

16. The magnetic memory according to claim 15,
wherein the current path includes a bit line connected to one end of the magnetic recording element and a MOS transistor connected to other end; and
a gate of the MOS transistor is connected to a word line.

17. The magnetic memory according to claim 15,
wherein the current path includes a bit line and a word line crossing each other, and
the magnetic recording element is arranged at a crossing portion of the bit line and the word line.

18. The magnetic memory according to claim 15,
wherein the magnetic free layer of the magnetic recording element is composed of aggregates of magnetic particles in which the magnetization direction is determined independently, and
the magnetic recording element is arranged along the bit line.

19. The magnetic memory according to claim 15,
wherein the magnetic free layer of the magnetic recording element is composed of aggregates of magnetic particles in which the magnetization direction is determined independently, and
the magnetic recording element is formed all over a memory cell array including a region between the bit line and the word line.

20. The magnetic memory according to claim 15,
wherein the current path is arranged on the magnetic recording element, and includes a probe whose relative position to the magnetic recording element is movable.

21. The magnetic memory according to claim 20,
wherein the magnetic memory is realized inside a semiconductor chip.

22. A spin FET comprising:
a magnetic free layer whose magnetization is variable and whose direction of easy axis of magnetization is a direction perpendicular to a film plane;
a magnetic pinned layer whose magnetization is fixed to a direction perpendicular to the film plane;
a channel region between the magnetic free layer and the magnetic pinned layer;
a gate insulating layer on the channel region; and
a gate electrode on the gate insulating layer,
wherein the magnetic free layer has a characteristics that a relation between a saturated magnetization Ms (emu/cc) and an anisotropy field Han (Oe) satisfies Han>12.57 Ms, and Han<1.2 E7 $Ms^{-1}$+12.57 Ms.

* * * * *